(12) United States Patent
Ohtani et al.

(10) Patent No.: US 9,295,176 B2
(45) Date of Patent: Mar. 22, 2016

(54) TOUCH PANEL

(71) Applicant: FUJIFILM Corporation, Tokyo (JP)

(72) Inventors: Sumio Ohtani, Minami-Ashigara (JP);
Tadashi Kuriki, Minami-Ashigara (JP)

(73) Assignee: FUJIFILM Corporation, Tokyo (JP)

( * ) Notice: Subject to any disclaimer, the term of this patent is extended or adjusted under 35 U.S.C. 154(b) by 132 days.

(21) Appl. No.: 13/886,654

(22) Filed: May 3, 2013

(65) Prior Publication Data

US 2013/0242485 A1    Sep. 19, 2013

Related U.S. Application Data

(63) Continuation of application No. PCT/JP2011/075118, filed on Oct. 31, 2011.

(30) Foreign Application Priority Data

Nov. 5, 2010   (JP) ................. 2010-249208

(51) Int. Cl.
*H05K 1/03*   (2006.01)
*H05K 7/02*   (2006.01)
*G06F 3/041*   (2006.01)

(52) U.S. Cl.
CPC .... *H05K 7/02* (2013.01); *G06F 3/041* (2013.01); *G06F 2203/04103* (2013.01); *G06F 2203/04104* (2013.01)

(58) Field of Classification Search
USPC ......... 174/255; 341/20, 34; 345/87, 173–175; 349/12, 106, 139, 143, 145
See application file for complete search history.

(56) References Cited

U.S. PATENT DOCUMENTS 5,844,506 A * 12/1998 Binstead .............. 341/34
5,986,739 A * 11/1999 Kobayashi ............ 349/143

(Continued)

FOREIGN PATENT DOCUMENTS

JP    3825487 B2    7/2006
JP    2009116433 A    5/2009

(Continued)

OTHER PUBLICATIONS

International Search Report (PCT/ISA/210) dated Jan. 17, 2012 issued by the International Searching Authority in counterpart International Application No. PCT/JP2011/075118.
Written Opinion (PCT/ISA/237) dated Jan. 17, 2012 issued by the International Searching Authority in counterpart International Application No. PCT/JP2011/075118.
Office Action, dated Mar. 11, 2014, issued by the Japanese Patent Office in counterpart Japanese Patent Application No. 2010-249208.
Office Action, dated Jul. 3, 2015, issued by the State Intellectual Property Office of P.R. China in counterpart Chinese Patent Application No. 201180064252.5.
Office Action issued Nov. 3, 2015 by the Taiwanese Patent Office in counterpart Taiwanese Application No. 100140166.

*Primary Examiner* — Xiaoliang Chen
(74) *Attorney, Agent, or Firm* — Sughrue Mion, PLLC

(57) ABSTRACT

A touch panel includes: a first electrode in which second-direction parallel bands having a plurality of conducting wires disposed to extend in parallel with one another and along a second direction intersecting with a first direction are formed repeatedly in the first direction with interposition of first-direction gaps in the first direction, and first-direction cross bands having conducting wires disposed to extend in the first direction and intersect with the second-direction parallel bands are formed repeatedly in the second direction; and a second electrode in which first-direction parallel bands are formed as defined herein, and second-direction cross bands are formed as defined herein, and the first electrode and the second electrode are laid on each other so that the second-direction cross bands correspond to positions of the first-direction gaps and the first-direction cross bands correspond to positions of the second-direction gaps.

17 Claims, 36 Drawing Sheets

(56) References Cited

U.S. PATENT DOCUMENTS

| | | | |
|---|---|---|---|
| 7,015,886 B2 * | 3/2006 | Matsuyama | 345/87 |
| 8,471,986 B2 * | 6/2013 | Katayama et al. | 349/106 |
| 2006/0097991 A1 * | 5/2006 | Hotelling et al. | 345/173 |
| 2007/0062739 A1 * | 3/2007 | Philipp et al. | 178/18.06 |
| 2009/0185088 A1 * | 7/2009 | Shinohara | 349/12 |
| 2009/0273572 A1 * | 11/2009 | Edwards et al. | 345/173 |
| 2010/0164889 A1 * | 7/2010 | Hristov et al. | 345/173 |
| 2010/0253647 A1 * | 10/2010 | Agari et al. | 345/174 |
| 2010/0265210 A1 * | 10/2010 | Nakanishi et al. | 345/174 |
| 2011/0102370 A1 * | 5/2011 | Kono et al. | 345/174 |

FOREIGN PATENT DOCUMENTS

| | | |
|---|---|---|
| JP | 201039537 A | 2/2010 |
| JP | 2010-277392 A | 12/2010 |
| WO | 2009108758 A2 | 9/2009 |
| WO | 2010013679 A1 | 2/2010 |

\* cited by examiner

TOUCH PANEL

This is a continuation of International Application No. PCT/JP2011/075118 filed on Oct. 31, 2011, and claims priority from Japanese Patent Application No. 2010-249208 filed on Nov. 5, 2010, the entire disclosures of which are incorporated herein by reference.

TECHNICAL FIELD

The present invention relates to a touch panel (touch screen). Particularly, the present invention relates to a capacitive touch panel or a resistive touch panel in which electrode arrays are formed out of a thin wire pattern in each of two different layers so that multiple touches can be detected.

BACKGROUND ART

Analog resistive technology in which electric conduction is detected in a touch position between two conductive layers (electrode layers) disposed to be opposed to each other through a dot spacer has been often used in touch panels (for example, Patent Literature 1). In recent years, capacitive touch panels in which a touch position of a fingertip is detected using a change of electrostatic capacitance have been being developed. The capacitive touch panels include a surface capacitive type and a projected capacitive type. The surface capacitive type has electrodes like a sheet. A transparent conductive film of ITO or the like has been heretofore used as a material of the electrodes. It is, however, difficult to provide a large screen in view of responsiveness due to the high resistance value of ITO. Therefore, a technique using a metal thin wire of gold, silver, copper or the like as the electrodes have been being developed (Patent Literature 2). The surface capacitive type touch panel is, for example, arranged so that the amount of analog current change in the conductive layer corresponding to the change of electrostatic capacitance between a finger and the conductive layer can be detected by electrodes in the four corners of the sheet. It is therefore difficult to detect two or more contacts (multiple touches) concurrently.

On the other hand, the projected capacitive type touch panel includes electrodes like a grid in which first electrode arrays whose array direction is a first direction and second electrode arrays whose array direction is a second direction perpendicular to the first direction are disposed perpendicularly to each other through a dielectric layer (Patent Literature 3). In this projected capacitive type, the change of electrostatic capacitance between the first electrode arrays and the second electrode arrays caused by capacitance coupling at the time of touch is detected as a change of voltage so that a coordinate point can be identified. It is therefore possible to detect multiple touch positions.

CITATION LIST

Patent Literature

Patent Literature 1: Japanese Patent No. 3825487
Patent Literature 2: WO 2009/108758
Patent Literature 3: WO 2010/013679

SUMMARY OF INVENTION

Technical Problem

In recent years, a request to detect multiple touches and a request to enlarge a screen have been increased. For these requests, it is preferable to use a projected capacitive type with two electrode layers and form electrodes using metal thin wires. Due to the structure in which electrode arrays in two directions are laid on each other perpendicularly to each other, care should be taken for positioning or the like when the metal thin wires are manufactured and when the electrode arrays are laid on each other. That is, when electrodes are formed out of metal thin wires, electrode arrays are, for example, formed out of a large number of parallel wires extending at a fixed interval and in parallel to one another and cross wires intersecting with the parallel wires. It is likely that the positional relationship between the metal thin wires of the electrode arrays in one direction and the metal thin wires of the electrode arrays in the other direction may be disturbed due to slight errors in laying those wires on each other, shape errors in the metal thin wires, etc. On this occasion, the phenomenon (spreading) that the portion where the metal thin wires approach each other looks thick, or interference fringes (moire) caused by light interference may occur easily. In recent years, high-resolution displays have been often mounted on portable electronic instruments or the like. Spreading or interference fringes may occur easily particularly when the interval of metal thin wires is narrowed to obtain sensibility high enough to be able to distinguish dots close to each other in a high-definition image on such a display. When the portion where spreading and interference fringes occur is recognized visually, there is a fear that the visual quality of the display may degrade. Therefore, very high accuracy is required for forming patterns and laying the pattern on each other, causing reduction in yield and increase in cost.

Incidentally, also in the resistive technology, it can be considered that two electrode layers are formed out of metal thin wires respectively. In this case, spreading or moire may occur easily when the two electrode layers are laid on each other, in the same manner as in the projected capacitive technology. Therefore, a similar problem to the aforementioned one also arises in the resistive technology.

An object of the present invention is to provide a touch panel which can be manufactured easily using thin wires such as metal thin wires.

Solution to Problem

A touch panel including:
a first electrode in which second-direction parallel bands having a plurality of conducting wires disposed to extend in parallel with one another and along a second direction intersecting with a first direction are formed repeatedly in the first direction with interposition of first-direction gaps in the first direction, and first-direction cross bands having conducting wires disposed to extend in the first direction and intersect with the second-direction parallel bands are formed repeatedly in the second direction; and a second electrode in which first-direction parallel bands having a plurality of conducting wires disposed to extend in parallel with one another and along the first direction are formed repeatedly in the second direction with interposition of second-direction gaps in the second direction, and second-direction cross bands having conducting wires disposed to extend in the second direction and intersect with the first-direction parallel bands are formed repeatedly in the first direction; the touch panel being characterized in that:

the first electrode and the second electrode are laid on each other so that the second-direction cross bands correspond to positions of the first-direction gaps and the first-direction cross bands correspond to positions of the second-direction gaps.

Effect of Invention

According to the touch panel of the present invention, due to large tolerance for errors in laying the first electrode and the second electrode on each other or for shape errors in the conducting wires, it is possible to obtain a novel conducting wire pattern whose grid-like shape does not look incompatible even when the first electrode and the second electrode are misaligned to some extent or there is a variety among the shapes of the conducting wires. That is, it is possible to provide a capacitive or resistive touch panel which can be manufactured easily using thin wires such as metal thin wires.

BRIEF DESCRIPTION OF DRAWINGS

FIG. 29 A plan view in which the upper electrode and the lower electrode laid one each other are seen through.

EMBODIMENTS FOR CARRYING OUT THE INVENTION

Embodiments of capacitive touch panels for explaining a mode for carrying out the invention will be described with reference to FIGS. 1 to 9.

The sign "–" used in this specification implies that numeral values indicated before and after the sign are included as a lower limit and an upper limit.

Figure 1:
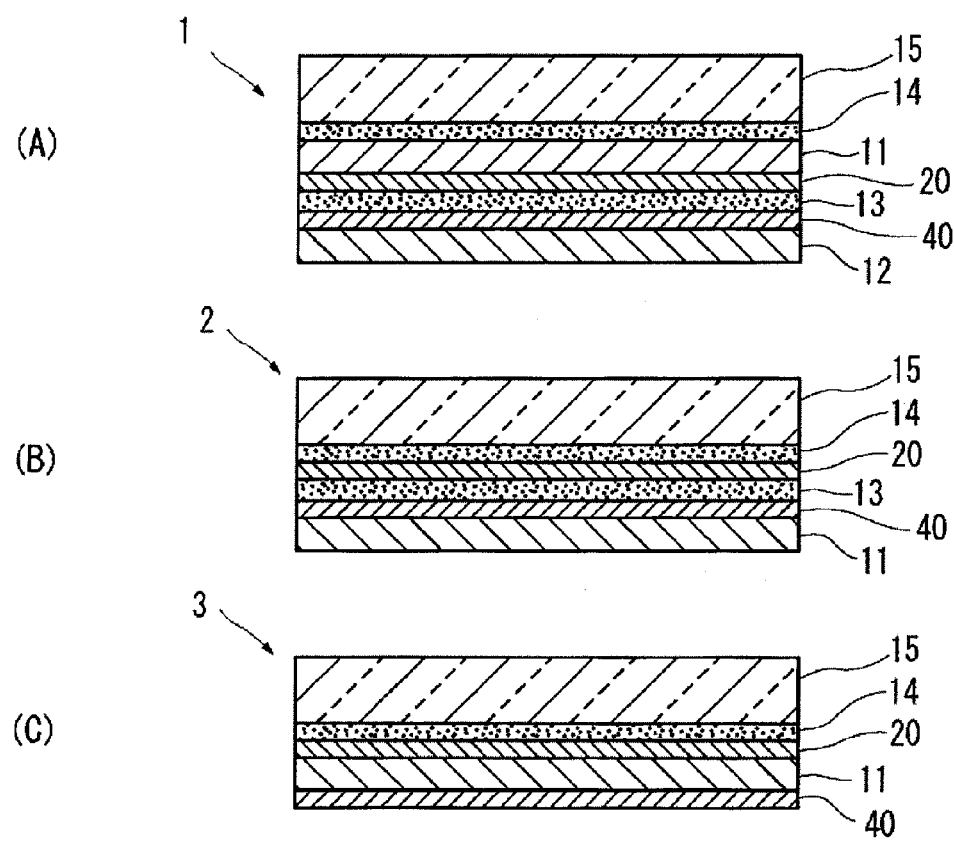
FIG. 1 Sectional views of capacitive touch panels as embodiments for explaining a mode for carrying out the invention.

(A) to (C) of FIG. 1 schematically show sectional views of embodiments of projected capacitive touch panels according to the present invention respectively. Each of the touch panels 1 to 3 is a stack of a plurality of layers, including an upper electrode 20 serving as a first electrode disposed on the side to be touched by a fingertip, and a lower electrode 40 laid on the upper electrode 20 and serving as a second electrode disposed on the side of a display 9 (FIG. 9) as an image display unit. The configurations of (A) to (C) of FIG. 1 are different from one another in the positions where the upper electrode 20 and the lower electrode 40 are arranged in the stack. Incidentally, each of the touch panels 1 to 3 may be formed integrally with the display.

In (A) of FIG. 1, an upper transparent substrate 11 where the upper electrode 20 has been formed and a lower transparent substrate 12 where the lower electrode 40 has been formed are pasted on each other so that their surfaces where the electrodes have been formed are opposed to each other through a transparent dielectric layer 13. A transparent cover member 15 made of glass or resin is provided on the upper transparent substrate 11 through an adhesive layer 14.

In (B) of FIG. 1, the lower electrode 40 is formed on the surface of one transparent substrate 11, and the upper electrode 20 is formed thereon through the dielectric layer 13.

In (C) of FIG. 1, the upper electrode 20 and the lower electrode 40 are formed in the front and back opposite surfaces of one transparent substrate 11 serving as a dielectric layer, respectively.

Although not shown in (A) to (C) of FIG. 1, a shield layer for shielding electromagnetic waves from the display may be provided in the surface of each of the touch panels 1 to 3 opposed to the display 9.

In the aforementioned touch panels 1 to 3, the same insulating material may be used for the transparent cover member 15, the transparent substrate 11, the transparent substrate 12 and the shield layer, or different insulating materials may be used therefor. They may be formed using plastic films, plastic plates, glass plates, etc. The thicknesses of these members, plates and layers are determined suitably in accordance with their applications.

For example, polyesters such as polyethylene terephthalate (PET), polyethylene naphthalate (PEN), etc.; polyolefins such as polyethylene (PE), polypropylene (PP), polystyrene, EVA, etc.; vinyl resins; others such as polycarbonate (PC), polyamide, polyimide, acrylic resin, triacetylcellulose (TAC), etc. may be used as the materials of the plastic films and the plastic plates.

Preferable materials of the plastic films and the plastic plates include plastic films, plastic plates, etc. whose melting points are not higher than about 290° C., such as PET (melting point: 258° C.), PEN (melting point: 269° C.), PE (melting point: 135° C.), PP (melting point: 163° C.), polystyrene (melting point: 230° C.), polyvinyl chloride (melting point: 180° C.), polyvinylidene chloride (melting point: 212° C.), TAC (melting point: 290° C.), etc. Particularly in view of light transmissivity, processing capability, etc., PET is preferred. The thickness of a film or a plate is preferably in a range of from 50 μm to 300 nm.

The dielectric layer 13 as a whole is formed as a non-conductive adhesive layer out of a material having an adherence property, or arranged to include a dielectric substrate and adhesive layers provided on the front and back sides of the substrate respectively. A non-conductive bonding agent or the like may be used for each adhesive layer included in the dielectric layer 13 configured thus, and for the adhesive layer 14 provided on the transparent cover member 15. Examples of materials of such bonding agents may include acrylic resin-based bonding agents, epoxy resin-based bonding agents, phenol resin-based bonding agents, vinyl resin-based bonding agents, etc. These adhesive layers are, for example, formed by a screen printing method or the like.

Figure 2:
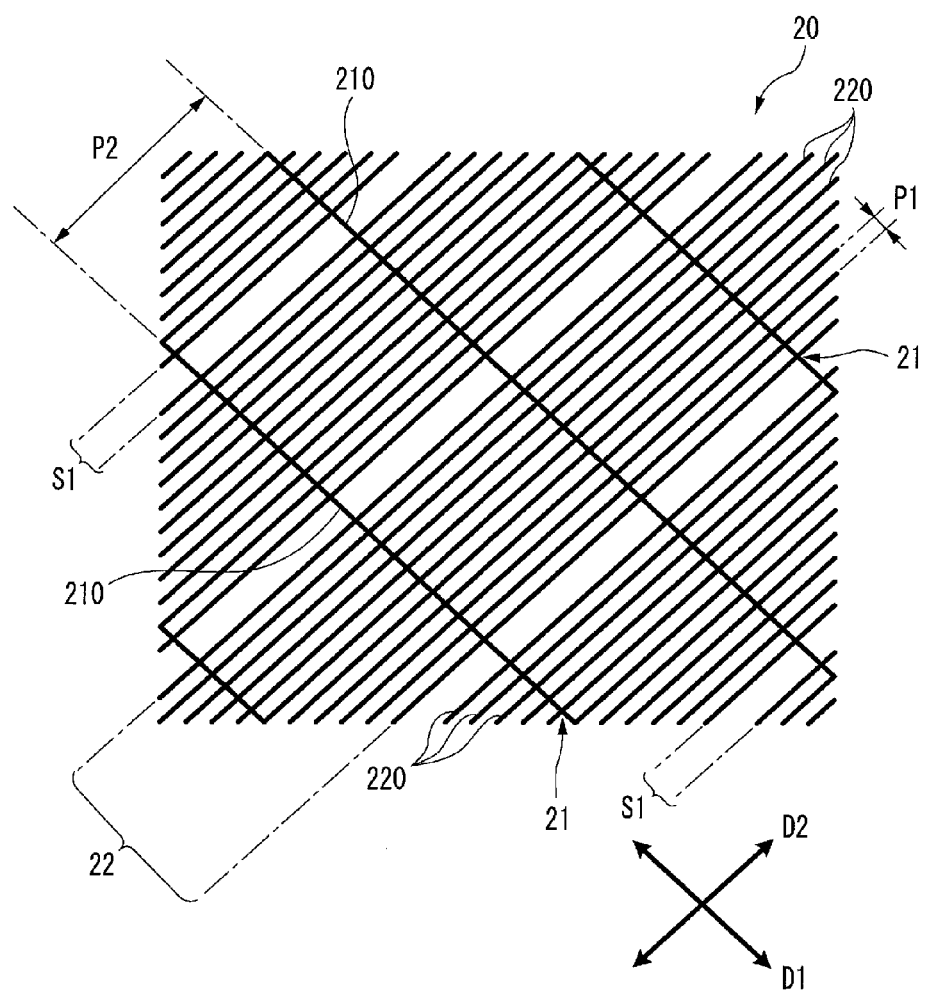
FIG. 2 A partially enlarged plan view showing an upper electrode in which first electrode arrays have not been formed.

FIG. 2 is a partially enlarged plan view of the upper electrode 20. In the state of FIG. 2, first electrode arrays belonging to the upper electrode 20 have not been formed. Here, FIGS. 2 to 8 schematically show the layout of conducting wire patterns, particularly with emphasis placed on conducting wires, whose widths are depicted to be thicker in comparison with the pitch among the conducting wires. The same thing can be applied to the partially enlarged plan views of various electrodes that will be described later. The widths, intervals, disconnection lengths, etc. of the conducting wires are determined suitably.

A large number of conducting wires (also referred to as metal thin wires) are formed on the transparent substrate where the upper electrode 20 is formed. Specifically, on the assumption that there are a first direction D1 and a second direction D2 intersecting therewith (not perpendicularly but substantially perpendicularly here), second-direction parallel bands 22 including a plurality of conducting wires 220 extending in parallel along the second direction D2 and first-direction cross bands 21 including conducting wires 210 intersecting with the second-direction parallel bands 22 are formed on the transparent substrate.

Each second-direction parallel band 22 is a belt-like region in which the conducting wires 220 are disposed at an equal interval. The second-direction parallel bands 22 are formed repeatedly in the first direction D1 and at intervals in the first direction with first-direction gaps S1 therebetween. Each first-direction gap S1 shown in FIG. 2 is set to be twice as large as a pitch P1 of the conducting wires 220. Such a layout of the second-direction parallel bands 22 and the first-direction gaps S1 can be regarded, in another view, as a layout in which some conducting wires 220 are thinned out in the configuration in which a large number of conducting wires 220 are formed at an equal interval all over the conducting wire pattern formation region of the substrate where the upper electrode 20 is formed.

In the layout of FIG. 2, the region occupied by each first-direction cross band 21 corresponds to the region where one conducting wire 210 is formed. However, each first-direction cross band may include two or more conducting wires. In this case, the first-direction parallel band is formed in a belt-like region including these conducting wires. In the case where each first-direction cross band is formed out of two or more conducting wires, electric continuity of an electrode array which will be described later may be secured by the other conducting wires even if some conducting wires are burnt out. The conducting wires 210 of the first-direction cross bands 21 are formed repeatedly at an equal pitch P2 with gaps therebetween in the second direction D2. The pitch P2 is larger than the pitch P1. The pitch P1 is preferably 100 μm to 500 μm, more preferably 150 μm to 400 μm, further preferably 250 μm to 350 μm.

On the other hand, the pitch P2 is preferably 1,000 μm to 20,000 μm, more preferably 2,000 μm to 10,000 μm, further preferably 3,500 μm to 7,000 μm. That is, as compared with the aforementioned conducting wires 220 disposed densely, the conducting wires 210 are disposed more sparsely.

Figure 3:
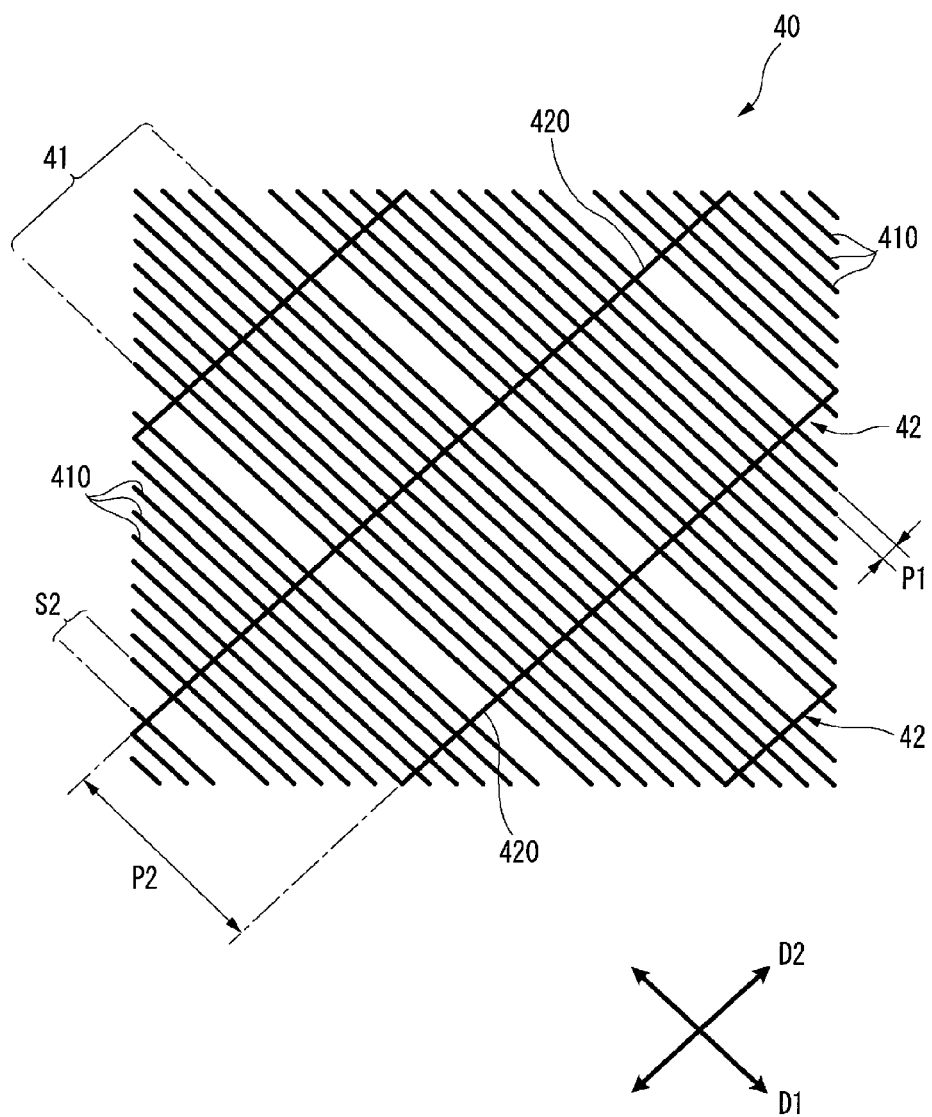
FIG. 3 A partially enlarged plan view showing a lower electrode in which second electrode arrays have not been formed.

FIG. 3 is a partially enlarged plan view of the lower electrode 40. In the state of FIG. 3, second electrode arrays belonging to the lower electrode 40 have not been formed. The conducting wires belonging to the lower electrode 40 are disposed substantially in the same manner as the conducting wires of the aforementioned upper electrode 20. The upper electrode 20 and the lower electrode 40 are put on each other so that the direction relationship in the conducting wire pattern of the upper electrode 20 is reversed to that in the conducting wire pattern of the lower electrode 40. Thus, when the lower electrode 40 is distinguished from the upper electrode 20 using the directions in which they are laid on each other, the second-direction parallel bands 22 each including a plurality of conducting wires 220 are formed in the upper electrode 20 while first-direction parallel bands 41 each including a plurality of conducting wires 410 are formed in the lower electrode 40. In addition, the first-direction cross bands 21 including the conducting wires 210 are formed in the upper electrode 20 while second-direction cross bands 42 including conducting wires 420 are formed in the lower electrode 40.

The first-direction parallel bands 41 are formed repeatedly in the direction D2 and at intervals in the second direction D2 with second-direction gaps S2 therebetween.

Here, a mirror-image relationship is established between the conducting wire pattern of the first electrode 20 and the conducting wire pattern of the second electrode 40 when the up/down direction in FIGS. 2 and 3 is regarded as a binding direction. That is, when a center line extending in the up/down direction of the paper is set, the conducting wire pattern of the first electrode 20 and the conducting wire pattern of the second electrode 40 are formed symmetrically with respect to the center line.

Description will be made on the detailed configuration including the intervals (pitches), widths, thicknesses, numbers, etc. of the metal thin wires as the conducting wires 210, 220, 410 and 420.

The pitch of the conducting wires 410 (FIG. 3) extending in the first direction and the pitch of the conducting wires 220 (FIG. 2) extending in the second direction may be not the same pitch P1 as described above, but different from each other. It is, however, preferable that the pitches are the same. Even when the pitches are different from each other, the ratio between the pitch of the conducting wires 410 and the pitch of the conducting wires 220 is preferably within two times.

In addition, as each metal thin wire is thinner in width, it is more difficult to recognize the metal thin wire visually, and it is more difficult to cause interference fringes. Therefore, the width of the metal thin wire is preferably not larger than 20 µm, more preferably not larger than 10 µm, further preferably not larger than 8 µm, particularly preferably not larger than 6 µm. On the contrary, as the wire width is thinner, processing is more difficult to result in the increase of the cost. Therefore, the width of the metal thin wire is preferably not smaller than 1 µm, more preferably not smaller than 2 µm, further preferably not smaller than 4 µm.

The thickness (height from the substrate surface) of each metal thin wire is preferably smaller because the thinner wire is hardly separated from the substrate. However, when the sectional area of the thin wire is reduced because the thin wire is too thin, the electric resistance becomes so high that the change quantity of electrostatic capacitance required for detecting contact becomes so short as to degrade the responsiveness. Therefore, the thickness of the metal thin wire is preferably not larger than 5 µm, more preferably 0.1 µm to 5 µm, further preferably 0.5 µm to 3 µm.

In order to prevent the metal thin wire from being separated, the ratio (width to thickness) of the width of the metal thin wire to the thickness thereof is preferably not lower than 2.5, more preferably not lower than 4.

In addition, the number of the conducting wires 410 constituting each first-direction parallel band 41 and the number of the conducting wires 220 constituting each second-direction parallel band 22 are each at least three (eleven). The number of the conducting wires 210 constituting each first-direction cross band 21 and the number of the conducting wires 420 constituting each second-direction cross band 42 are each not smaller than one and not larger than ten (one) but smaller than any one of the number (eleven) of the conducting wires 410 constituting the first-direction parallel band 41 and the number (eleven) of the conducting wires 220 constituting the second-direction parallel band 22.

The material of the metal thin wires and the method for manufacturing the metal thin wires will be described later.

Figure 4:
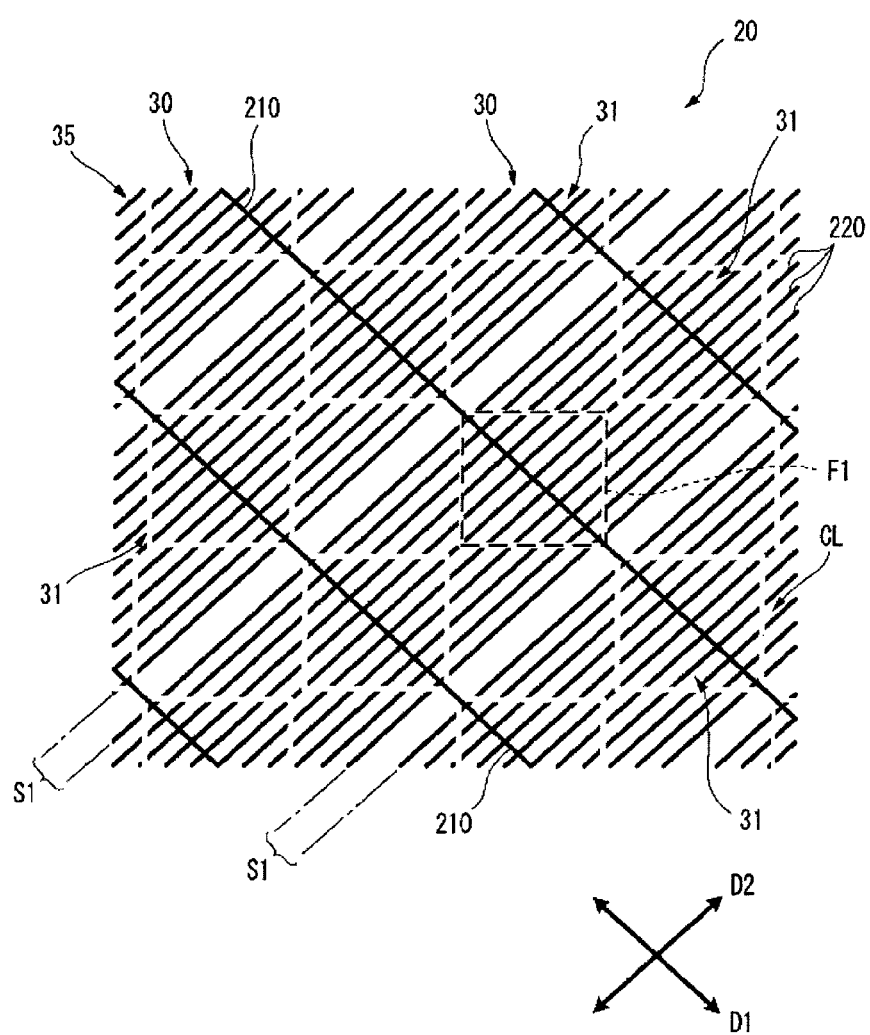
FIG. 4 A partially enlarged plan view showing the upper electrode in which the first electrode arrays have been formed.

FIG. 4 is a partially enlarged plan view of the upper electrode 20 in which the first electrode arrays 30 have been formed.

Each first electrode array 30 includes a plurality of electrode pieces 31 arrayed in the first direction D1 and each shaped like a quadrangle (closed figure). Each electrode piece 31 is formed by partial and selective disconnection in each pattern of the conducting wires 210 and 220 intersecting with the sides (edge line) of a quadrangle F1 assumed on the upper electrode 20. Specifically, of the conducting wires 210 and 220 intersecting with the sides of the quadrangle F1, the conducting wires 220 are disconnected but the conducting wire 210 is not disconnected. The apexes of one diagonal corners in the quadrangle F1 pass through the positions of two first-direction gaps S1 adjacent to each other on the conducting wire 210 respectively. The conducting wires 220 are disconnected so that electrode pieces 31 as a group of regions electrically connected to one another by the conducting wire 210 can be sectioned within the quadrangles F1 respectively and a first electrode array 30 in which the electrode pieces 31 are electrically connected by the conducting wire 210 can be formed. Such first electrode arrays 30 are formed for the conducting wires 210 respectively, and disposed repeatedly in the second direction D2.

Incidentally, the conducting wires are shown with emphasis placed on their disconnected portions, which are depicted to be larger than their real size. The same thing can be applied to the other drawings.

When the conducting wires 220 are disconnected in this manner, the first electrode arrays 30 are formed, and conducting wire pieces which are not electrically connected to any other conducting wires but electrically isolated therefrom are formed between the first electrode array 30 and the first electrode array 30, that is, outside the quadrangles F1. These groups of conducting wire pieces are generically referred to as dummy electrodes 35. That is, the conducting wire pattern formation region of the upper electrode 20 shown in FIG. 4 (a part of the region is shown in FIG. 4) is sectioned into the first electrode arrays 30 and the dummy electrodes 35 by the disconnection. The dummy electrodes 35 may be grounded to the reference potential (GND) of the circuit. The formation of the dummy electrodes 35 leads to reduction in parasitic capacitance between electrode arrays so that electrode arrays adjacent to each other can be prevented from being short-circuited during high-frequency drive.

Figure 5:
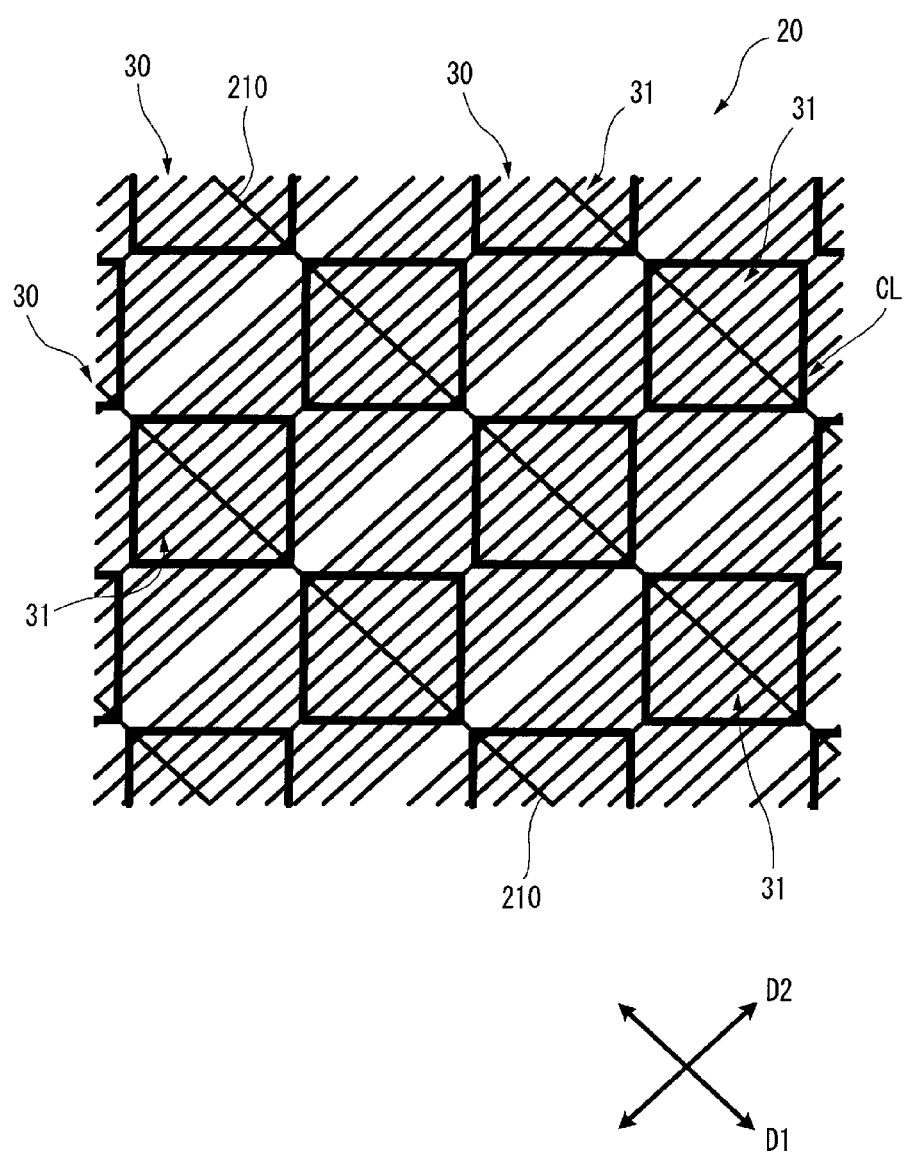
FIG. 5 A partially enlarged plan view showing the upper electrode whose disconnected portions are depicted by the solid lines.

Each set of portions where conducting wires are disconnected will be hereinafter referred to as a disconnection part CL. That is, the disconnection part CL is formed into a shape following the disconnected portions of the conducting wires. FIG. 5 is a plan view of the upper electrode 20 depicted with emphasis placed on the disconnection parts CL by the thick solid lines. Here, the disconnection parts CL may be formed by partial removal of conducting wires, or may be formed by patterning of conducting wires for forming conducting wire patterns with gaps on the same lines.

Description will be made on the detailed configuration as to the shapes, dimensions, etc. of the disconnection parts CL. The patterns of the disconnection parts CL preferably have polygonal shapes having the same shape and the same area, particularly squares or rhombuses among the polygonal shapes.

The width (disconnection length) of each disconnection part CL, that is, the distance between a thin wire end portion and a thin wire end portion formed as a result of segmentation caused by disconnection (the size of disconnection in the disconnection part CL in a direction intersecting with an edge line of the quadrangle F1) is preferably not smaller than 10 μm.

There is not a special upper limit in the width (disconnection length) of the disconnection part CL. In order to prevent the pattern design from being complicated, it is preferable that the width of the disconnection part CL is determined using the interval (pitch) length of the metal thin wires as the upper limit.

Figure 6:
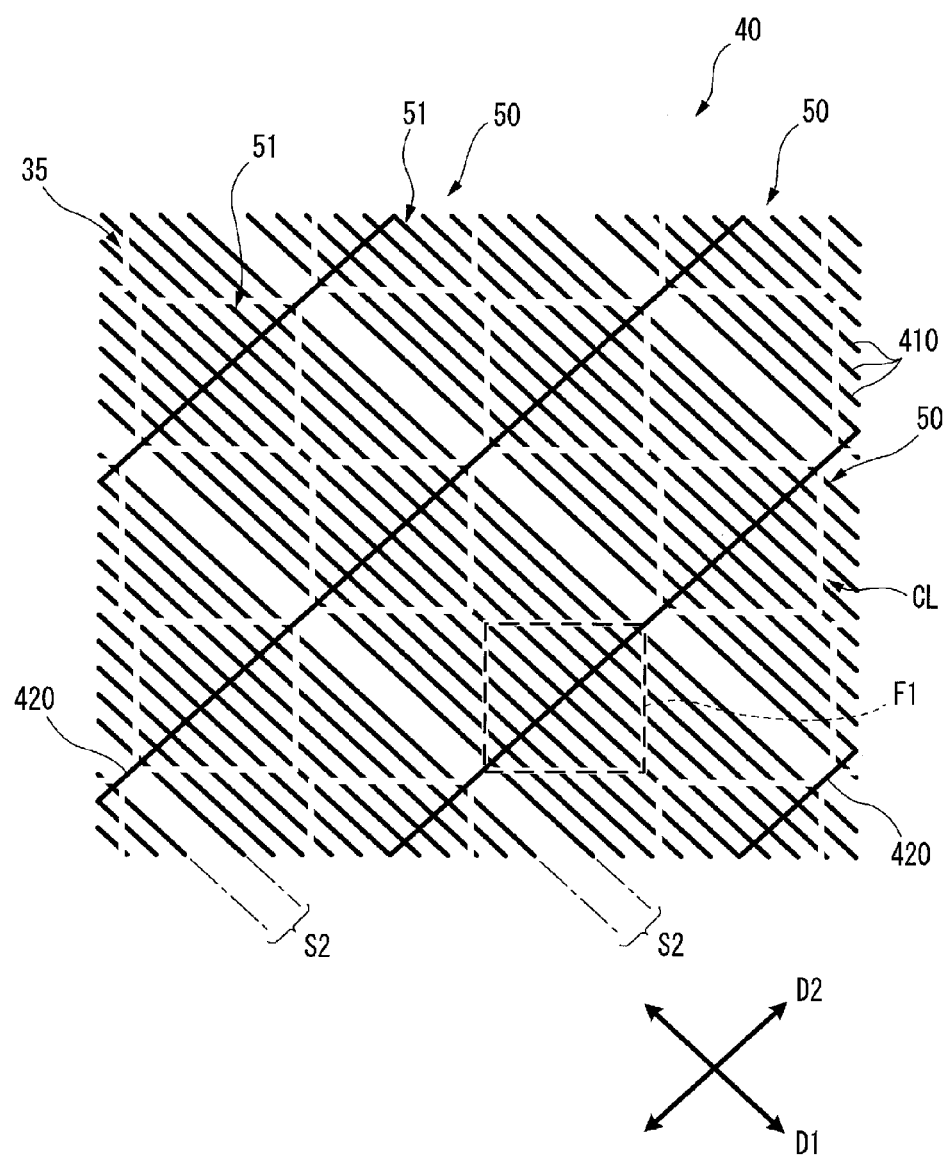
FIG. 6 A partially enlarged plan view showing the lower electrode in which the second electrode arrays have been formed.
Figure 7:
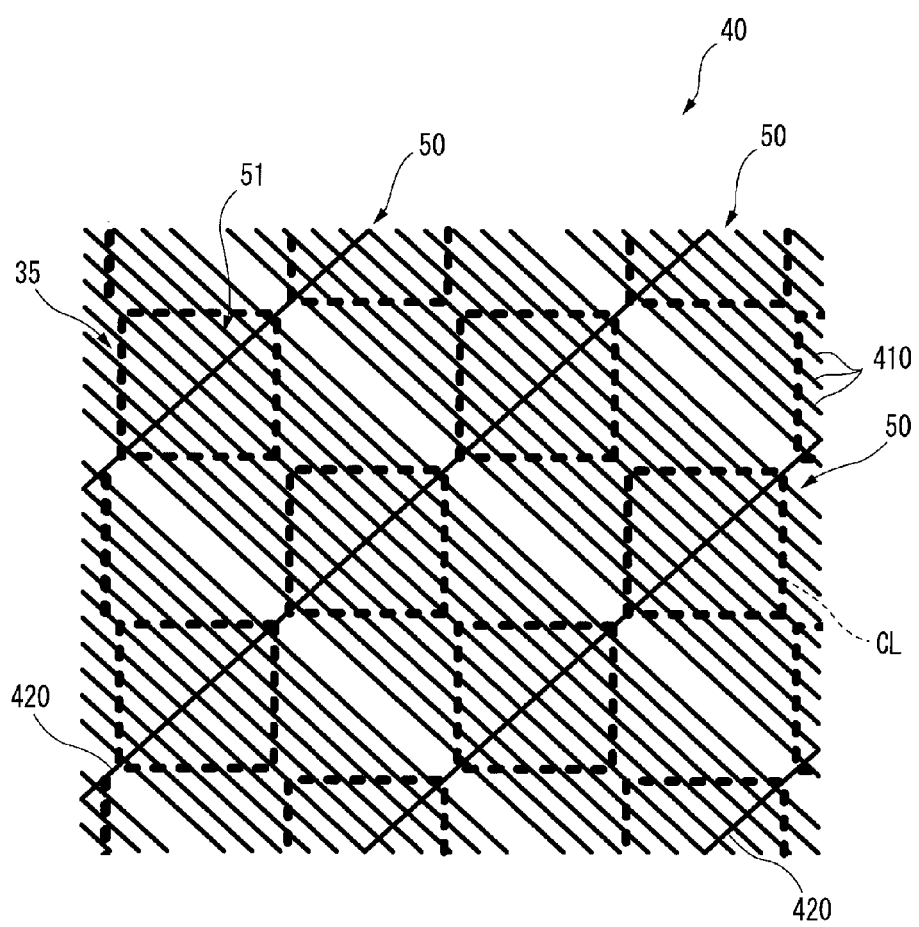
FIG. 7 A partially enlarged plan view showing the lower electrode whose disconnected portions are depicted by the broken lines.

FIG. 6 is a partially enlarged plan view of the lower electrode 40 in which second electrode arrays 50 have been formed. Each second electrode array 50 includes a plurality of electrode pieces 51 arrayed in the second direction D2 and each shaped like a quadrangle. Each electrode piece 51 is formed in the same manner as the aforementioned electrode piece 31, except for the array direction. That is, of the conducting wires 410 and 420 intersecting with the sides of the quadrangle F1, the conducting wires 410 are disconnected but the conducting wire 420 is not disconnected. In this manner, the second electrode arrays 50 in each of which the electrode pieces 51 are electrically connected by the conducting wire 420 are formed. FIG. 7 is a plan view of the second electrode arrays 50 depicted with emphasis placed on the disconnection parts CL by the thick broken lines.

Figure 8:
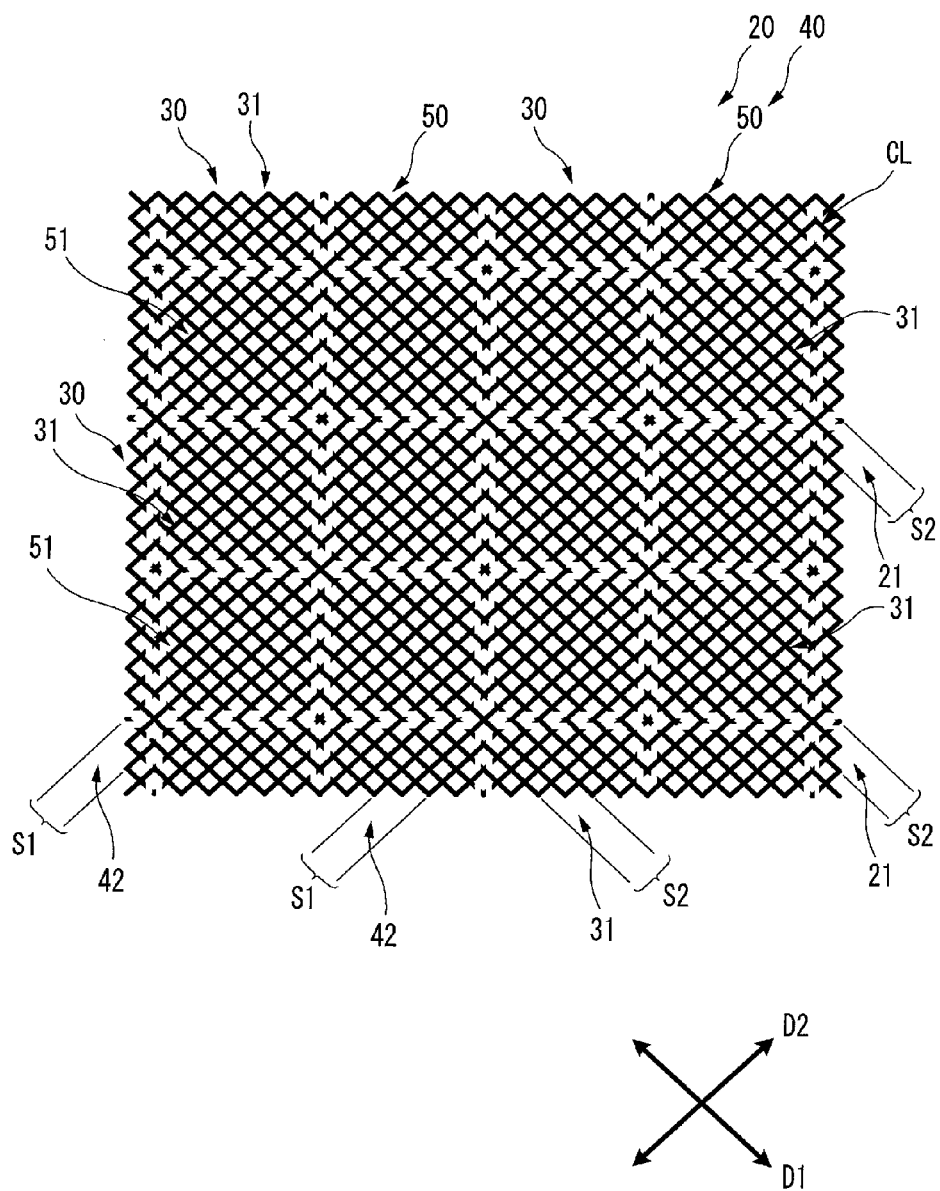
FIG. 8 A see-through view of the upper electrode and the lower electrode laid one each other.

FIG. 8 is a see-through plan view showing the state where the upper electrode 20 in FIG. 4 and the lower electrode 40 in FIG. 6 have been laid on each other. The upper electrode 20 and the lower electrode 40 are laid on each other through the dielectric layer 13 (FIG. 1) so that the array direction (the first direction D1) of the electrode pieces 31 in each first electrode array 30 is substantially perpendicular to the array direction (the second direction D2) of the electrode pieces 51 in each second electrode array 50. When the upper electrode 20 and the lower electrode 40 are laid on each other in this manner, the first electrode arrays 30 are superimposed on the dummy electrodes 35 of the lower electrode 40 side, and the second electrode arrays 50 are superimposed on the dummy electrodes 35 of the upper electrode 20 side. Thus, the first electrode arrays 30 and the second electrode arrays 50 are not superposed on each other. That is, the electrode pieces 31 of the first electrode arrays 30 and the electrode pieces 51 of the second electrode arrays 50 are not superimposed on each other but are arrayed densely in the first direction D1 and the second direction D2. Four electrode pieces 31, 31, 51 and 51 are disposed near a point where each first-direction gap S1 intersects with each second-direction gap S2, so that the corners of the electrode pieces 31, 31, 51 and 51 can abut against one another.

The angle with which the first direction D1 and the second direction D2 intersect with each other correlates with the shape of each electrode piece 31, 51. The angle and the shape are determined suitably. The electrode pieces shaped like a closed figure may have a polygonal shape such as a rhombus, a square or a rectangle, or another shape such as a circle or an ellipse. Incidentally, the closed figure means a figure that is internally provided with a space sectioned and closed by at least one line.

Here, in the state where the upper electrode 20 and the lower electrode 40 have been laid on each other, the second-direction cross bands 42 (also see FIG. 3) are disposed in the positions of the first-direction gaps S1 of the upper electrode 20, and the first-direction cross bands 21 (also see FIG. 2) are disposed in the positions of the second-direction gaps S2 of the lower electrode 40. That is, the first-direction cross bands 21 of the upper electrode 20 are arrayed at a pitch equal to the total width of each first-direction parallel band 41 and each second-direction gap S2 formed in the lower electrode 40, and the second-direction cross bands 42 of the lower electrode are arrayed at a pitch equal to the total width of each second-direction parallel band 22 and each first-direction gap S1 formed in the upper electrode 20.

Here, the conducting wires 220, 221, 410 and 420 form a perfect grid-like pattern in which no overlapping (spreading) of lines occurs except for the intersections of these conducting wires with each other.

In this manner, the second- and first-direction gaps S2 and S1 correspond to the positions of the first- and second-direction cross bands 21 and 42 respectively. Thus, due to high tolerance for errors in laying the upper electrode 20 and the lower electrode 40 on each other or for shape errors in the conducting wire pattern, the conducting wires seldom overlap each other or approach each other. Thus, a uniform grid-like pattern is formed all over the conducting wire pattern formation region of the substrate. That is, when the first electrode 20 and the second electrode 40 are seen through, the conducting wires 410 (FIG. 3) and the conducting wires 210 (FIG. 2) are arranged at a fixed interval P2 to each other, and the conducting wires 220 (FIG. 2) and the conducting wires 420 (FIG. 3) are also arranged at a fixed pitch P1 to each other. In this manner, the in-plane distribution of the conducting wires in the conducting wire pattern formation region on the transparent substrate is made so uniform that the conducting wire pattern can be prevented from being sensed as uneven with regularity.

Incidentally, the dummy electrodes 35 contribute to both the improvement of the visual quality caused by the uniform in-plane distribution of the conducting wire pattern, and the prevention of short-circuit during high-frequency drive. The dummy electrodes 35 configured thus separate adjacent ones of the electrode arrays from each other, so that the disconnection lengths of the disconnection parts CL can be determined to be short without consideration of short-circuit during the high-frequency drive. The width (disconnection length) of each disconnection part CL is preferably set to be not smaller than 10 μm as described previously. Practically, the width may be determined to be slight as compared with the pitch between the conducting wires. Thus, the disconnection parts CL are rarely observed visually. Although the disconnection parts CL can be seen in FIG. 8 which is a partially enlarged view, the disconnection parts CL cannot be observed visually on a real scale.

Figure 9:
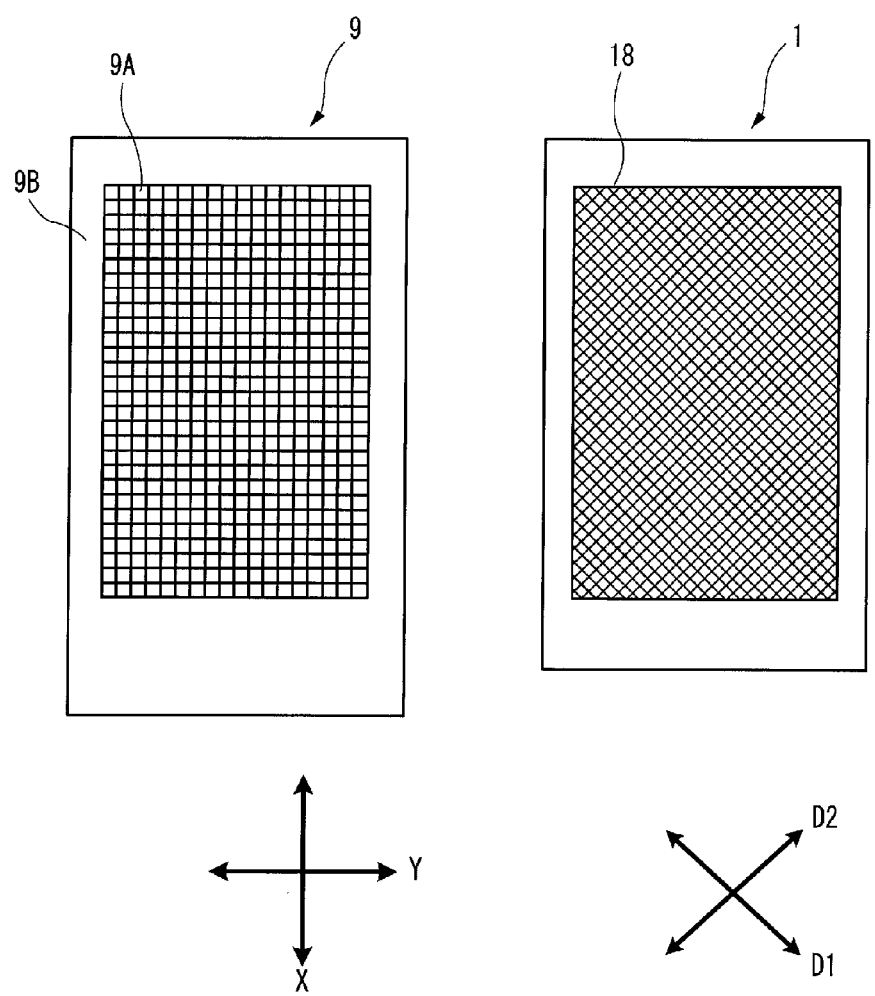
FIG. 9 A plan view showing the schematic configurations of the touch panel and a display.

FIG. 9 is a plan view schematically showing the schematic configurations of the touch panel 1 (or the touch panel 2 or 3) and the display 9 stacked on this touch panel. An image display apparatus is made up of these touch panel 1 and display 9.

The display 9 has a rectangular image display portion 9A in which a large number of pixel electrodes are arranged in the X direction and the Y direction, and a frame portion 9B to which not-shown wirings electrically connected to the pixel electrodes are led out. Here, the first direction D1 and the second direction D2 which are the extension directions of the conducting wires 210, 220, 410 and 420 disposed in the conducting wire pattern formation region 18 of the touch panel 1 have inclination angles of about 45 degrees with the four sides of the image display portion 9A respectively. That is, the array direction (the first direction D1) of the electrode pieces 31 in the first electrode arrays 30 and the array direction (the second direction D2) of the electrode pieces 51 in the second electrode arrays 50 have inclination angles of about 45 degrees with the directions of the four sides of the image display portion 9A, that is, with both the array direction of the pixel electrodes in the X direction and the array direction of the pixel electrodes in the Y direction.

In this manner, the extension directions of the conducting wires 210, 220, 410 and 420 are inclined with respect to the array directions of the pixel electrodes so that interference fringes can be prevented from occurring due to light interference between the conducting wires of the touch panel 1 and the pixel electrodes of the display 9. Here, the inclination angles may be increased or decreased to be around 45 degrees, for example, within a range of from 30 degrees to 60 degrees in accordance with the shape of the pixel electrodes. Thus, the inclination angles may be determined to minimize the occurrence of interference fringes.

In the aforementioned manner, the first direction D1 and the second direction D2 are inclined with respect to the X direction and the Y direction of the image display portion 9A. Thus, the axes of position coordinates showing a touch point are inclined with respect to the array directions of the pixel electrodes. The coordinates on the touch panel 1 can be corrected to coincide with the coordinates on the display 9 easily when the intersecting positions of the first and second electrode arrays 30 and 50 are converted into positions on the XY coordinates using arithmetic processing by a processor, software processing by a computer, or the like.

Figure 10:
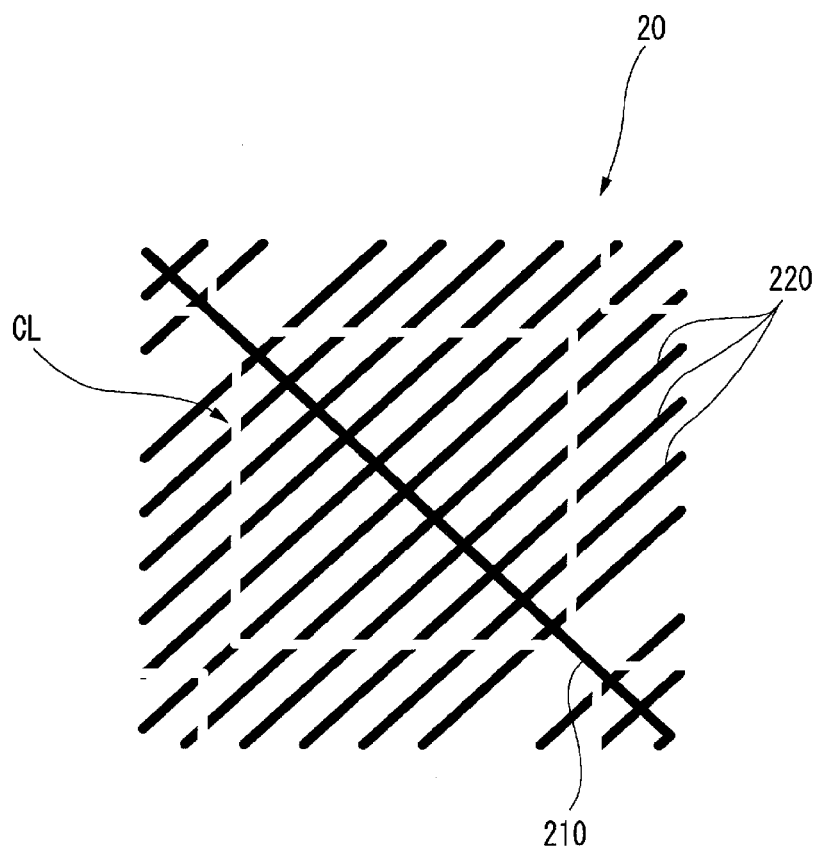
FIG. 10 A main portion enlarged plan view of an upper electrode in a modification of the aforementioned embodiment.
Figure 11:
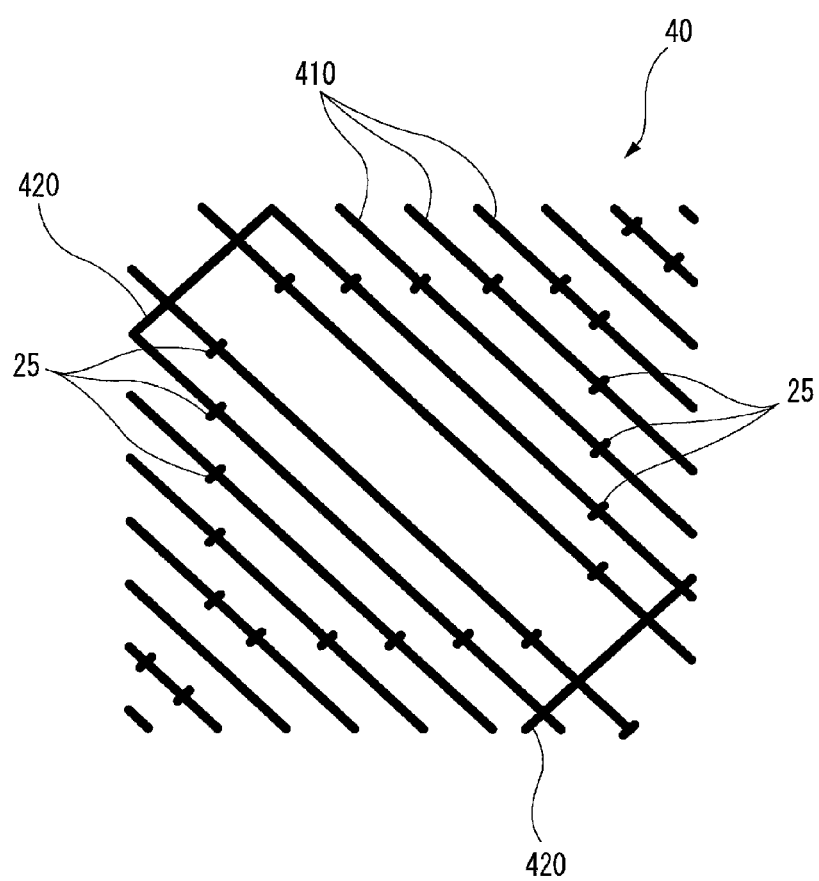
FIG. 11 A main portion enlarged plan view of a lower electrode.
Figure 12:
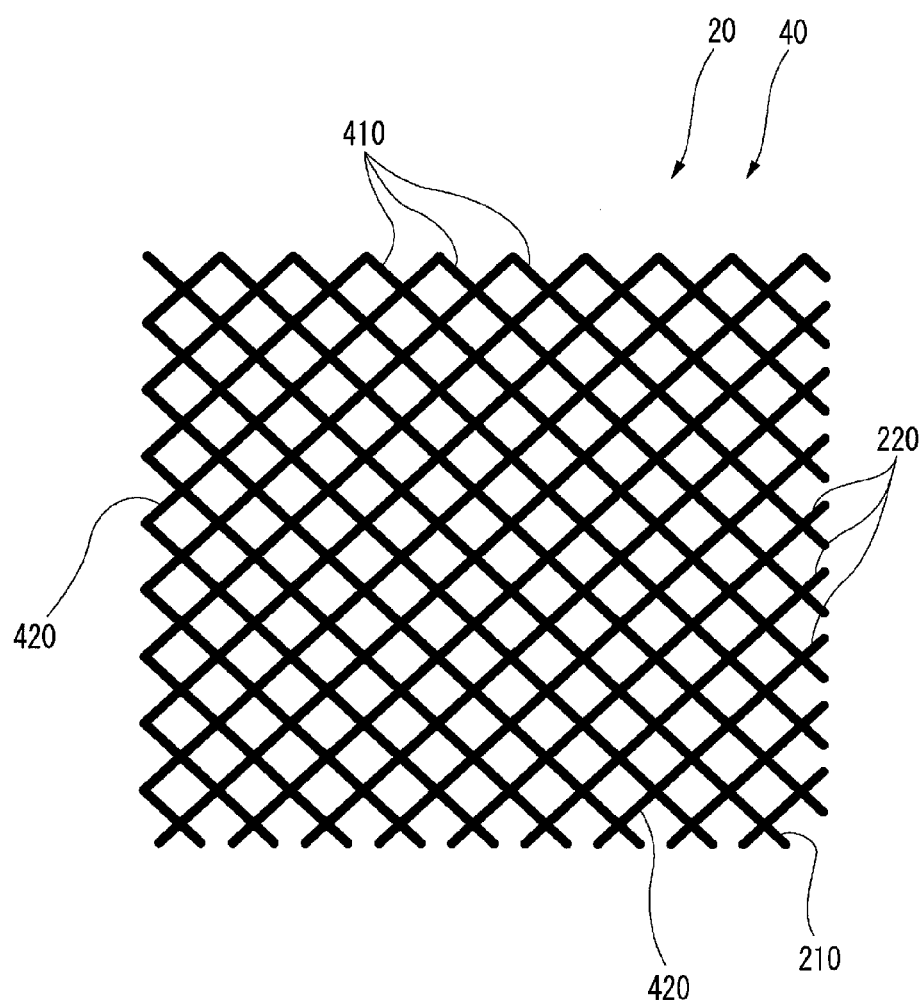
FIG. 12 A see-through view of the upper electrode and the lower electrode laid one each other.

FIGS. 10 to 12 show a modification of the aforementioned embodiment. FIG. 10 is a main portion enlarged plan view of the upper electrode 20. FIG. 11 is a main portion enlarged plan view of the lower electrode 40. A large number of auxiliary thin wires 25 (FIG. 11) corresponding to the disconnection parts CL (FIG. 10) in the upper electrode 20 are formed on the transparent substrate where the lower electrode 40 is formed. The auxiliary thin wires 25 are electrically connected to the conducting wire pieces which form the dummy electrodes 35. Although not shown, a large number of auxiliary thin wires 25 corresponding to the disconnection parts CL in the lower electrode 40 are also formed on the transparent substrate where the upper electrode 20 is formed. Due to these auxiliary thin wires 25 filling up the disconnection parts CL, a grid-like pattern based on the conducting wire patterns appears to be mad up of a large number of continuous thin wires in the state where the upper electrode 20 and the lower electrode 40 are seen through as shown in FIG. 12.

As described previously, each disconnection part CL has a slight width as compared with the pitch between the conducting wires. Accordingly, even if the auxiliary thin wires 25 are not formed, a perfect grid-like pattern based on the conducting wire patterns can be recognized visually. However, it is preferable that the auxiliary thin wires 25 are formed thus so that a perfect grid-like shape can be obtained more surely while the disconnection parts CL are hardly recognized visually.

Figure 13:
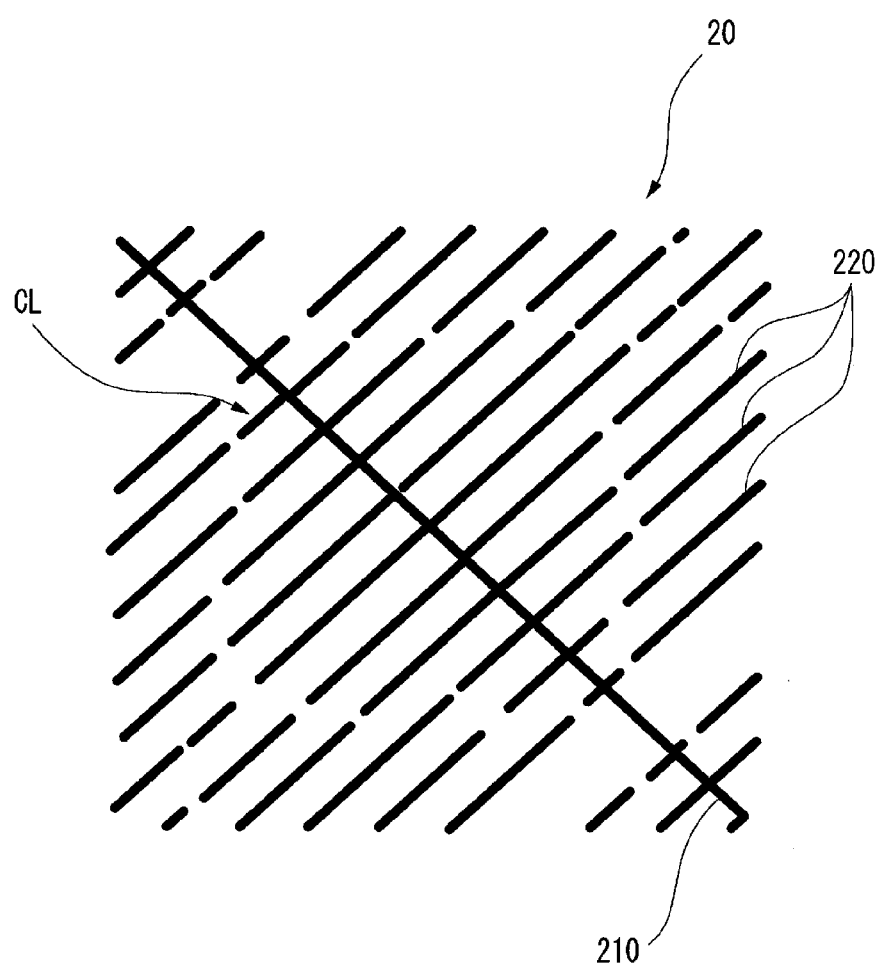
FIG. 13 A main portion enlarged plan view of an upper electrode in another modification of the aforementioned embodiment.
Figure 14:
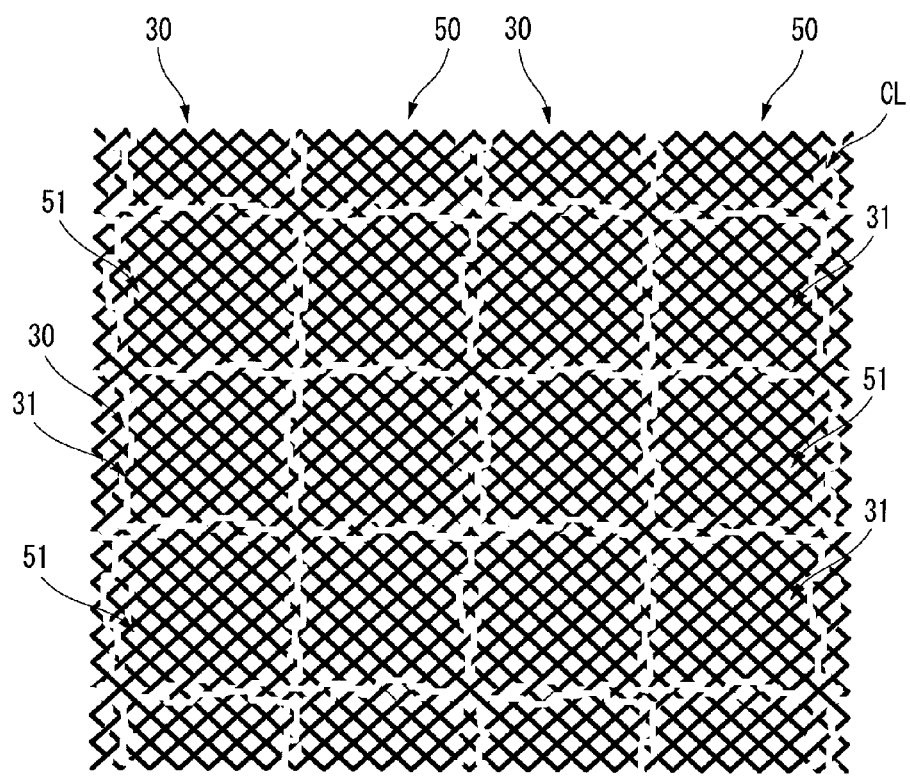
FIG. 14 A see-through view of the upper electrode and the lower electrode laid one each other.
Figure 14:
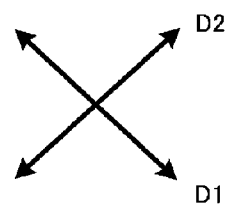

FIG. 13 and FIG. 14 show another modification of the embodiment described with reference to FIG. 1 to FIG. 9. The width of each of the aforementioned disconnection parts CL is set to be small enough not to be easily recognized visually, for example, not larger than 50 mm. Even in this case, the disconnection parts CL can be sensed as uneven with regularity due to a difference in light transmittance between an electrode portion and a non-conducting portion, a difference in reflectance, a different in intrinsic color including luster, etc. The modification can provide a solution to this problem.

In the upper electrode 20 shown in FIG. 13, the disconnection part CL sectioning each electrode piece is formed so that the width (disconnection size) thereof and the disconnection position thereof can change at random in the length direction. The width of the disconnection part CL is grasped using a line obtained by smoothing a line following the disconnected end portions of the conducting wires. Here, the individual conducting wires forming the disconnection part CL are disconnected to be positioned substantially zigzag with respect to a reference line (not shown) along the longitudinal direction of the disconnection part CL, and to be changed in disconnection length. Incidentally, the conducting wires may be disconnected zigzag regularly, that is, in positions swinging alternately on the opposite sides of the reference line. It is, however, preferable that the conducting wires are disconnected in order complicated enough to make it difficult to observe regularity, or in positions swinging irregularly, so that the disconnection part cannot be easily recognized visually. In addition, the reference line does not have to be set particularly, but the maximum width size in the region where the disconnection part can be formed may be set so that the conducting wires can be disconnected in random positions with random widths within the range of the maximum width.

Although not shown, also in the lower electrode 40, the width of each disconnection part CL and the disconnection positions are configured to change at random in the length direction of the disconnection part CL.

FIG. 14 is a see-though view showing the state where the upper electrode 20 and the lower electrode 40 have been laid on each other. When the width of each disconnection part CL and the disconnection positions are set at random, the disconnection part CL cannot be easily recognized visually even in the upper electrode 20 shown in FIG. 13 alone. However, in the see-through state as shown in FIG. 14, the effect that the disconnection part CL cannot be easily recognized visually can be enhanced. That is, when the disconnection parts CL are formed to be not random but linearly as described above in FIG. 8, it cannot be said that there is no fear that the lines of the disconnection parts CL in the upper and lower layers running in parallel are recognized visually in a see-though state. However, when the widths of the disconnection parts CL and the disconnection positions are set at random, the existence of the disconnection parts CL can be prevented from standing out.

Incidentally, when both the widths of the disconnection parts CL and the disconnection positions are not random but either is random, the effect that the disconnection parts CL can be prevented from standing out can be obtained. However, when the both are made random, the effect can be enhanced. In addition, the widths of the disconnection parts CL and the disconnection positions shown in FIG. 13 and FIG. 14 are merely exemplary. It is preferable that the random configuration of the disconnection parts CL is determined to avoid the same randomization between the portions of the disconnection parts CL close to each other so that the disconnection parts CL can be prevented from being recognized visually as uneven with regularity. For example, it is preferable that the random configuration of the disconnection parts CL is determined to avoid the same randomization between the disconnection lengths and the disconnection positions of adjacent electrode pieces in the see-through state.

Further, it is preferable that the disconnection lengths and the disconnection positions in the disconnection parts CL on the upper electrode side and the disconnection lengths and the disconnection positions in the disconnection parts CL on the lower electrode side are determined to prevent regularity from occurring when the upper electrode 20 and the lower electrode 40 are laid on each other.

Next, another embodiment of a touch panel for explaining a mode for carrying out the present invention will be described with reference to FIG. 15 to FIG. 22. In this embodiment, a conducting wire pattern different from that in the aforementioned embodiment will be presented.

Figure 15:
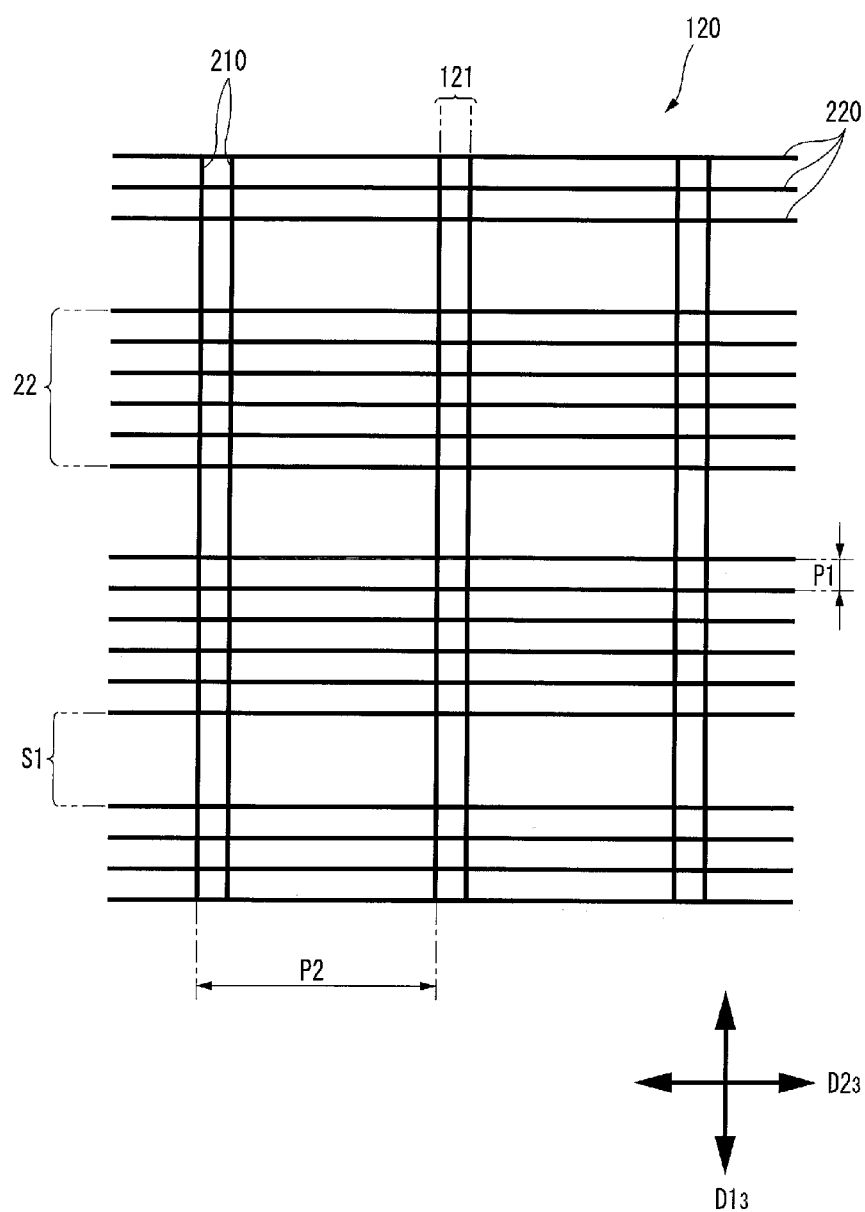
FIG. 15 A partially enlarged plan view showing an upper electrode in which first electrode arrays have not been formed, according to another embodiment for explaining a mode for carrying out the invention.

FIG. 15 is a partially enlarged plan view of an upper electrode 120 where electrodes have not been formed. On the assumption that there are a first direction $D1_3$ which corresponds to the longitudinal direction of the paper and a second direction $D2_3$ which is perpendicular to the first direction $D1_3$ and which corresponds to the lateral direction of the paper, a plurality of conducting wires 220 (lateral lines) extending in parallel along the second direction $D2_3$ and conducting wires 210 (longitudinal lines) extending perpendicularly to these conducting wires 220 and along the first direction $D1_3$ are formed on a transparent substrate where the upper electrode 120 is formed. The number of the conducting wires, the intersecting angle of the conducting wires, the intervals among the conducting wires, etc. are different from those in the upper electrode 20 described previously. Also in this embodiment, second-direction parallel bands 22 including the conducting wires 220 are formed repeatedly to put first-direction gaps S1 therebetween in substantially the same manner as in the aforementioned embodiment. In addition, first-direction cross bands 121 including the conducting wires 210 are also formed in substantially the same manner as in the aforementioned first-direction cross bands 21. However, each first-direction cross band 121 in this embodiment is formed to include two conducting wires 210.

Here, the configuration of the second-direction parallel bands 22 corresponds to the configuration in which some conducting wires 220 are thinned out from a large number of conducting wires 220 formed at an equal interval as described previously. In the same manner, it can be also said that the configuration of the first-direction cross bands 121 corresponds to the configuration in which some conducting wires 210 are thinned out from a large number of conducting wires 210 formed at an equal interval. Six conducting wires 210 are absent (thinned out) between the first-direction cross band 121 and the first-direction cross band 121 adjacent to each other. The portion where the conducting wires 210 are absent corresponds to the gap (the first-direction gap S1) for the second-direction parallel bands 22 constituted by the conducting wires 220. The same thing can be applied to the conducting wires 210 in the aforementioned embodiment described with reference to FIG. 1 to FIG. 9. A gap formed by thinning out at least one conducting wire 210 can be regarded as present between the first-direction cross band 21 and the first-direction cross band 21 adjacent to each other in the aforementioned embodiment (see FIG. 2). That is, thinning out some from a large number of conducting wires is a common configuration between the conducting wires 210 and 220.

Figure 16:
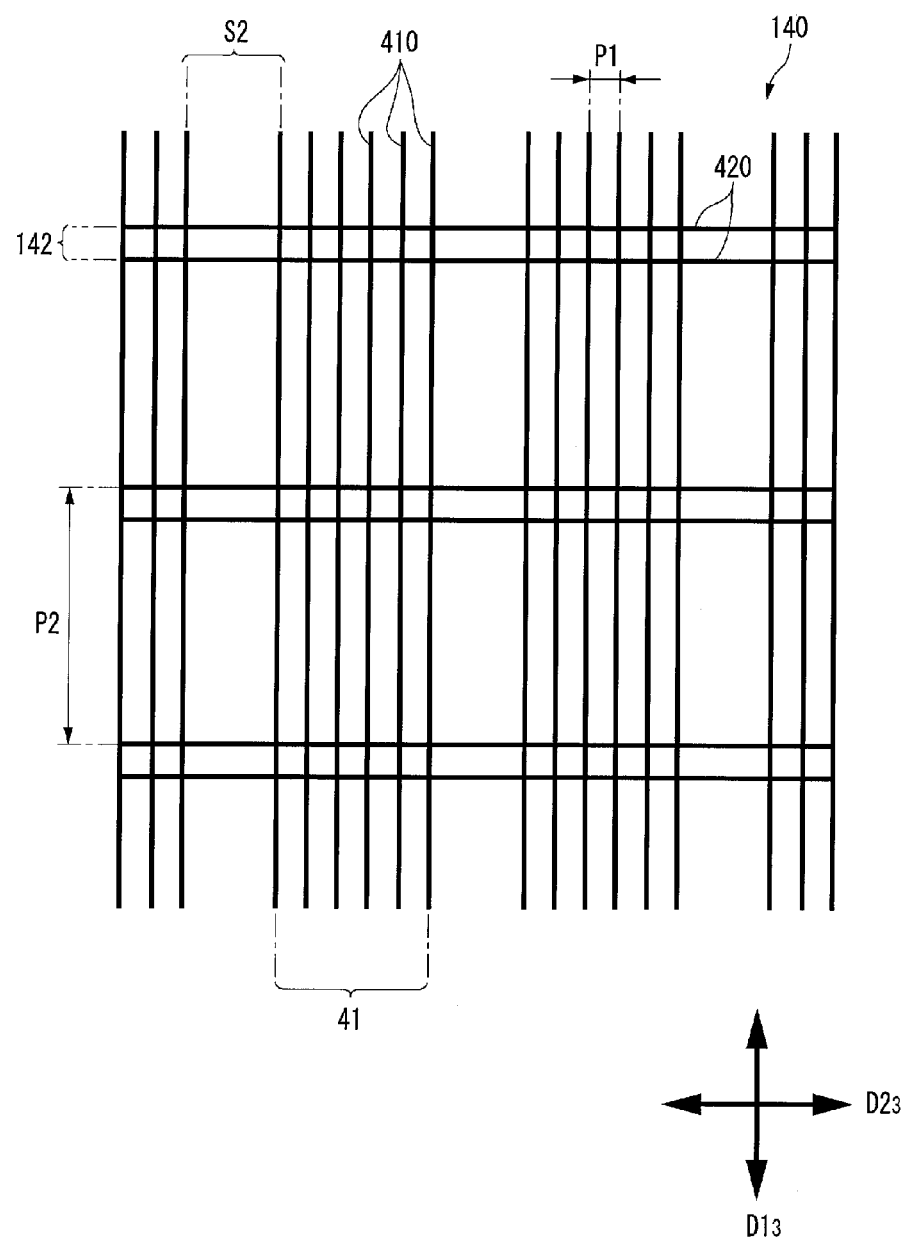
FIG. 16 A partially enlarged plan view showing a lower electrode in which second electrode arrays have not been formed.

FIG. 16 is a partially enlarged plan view of a lower electrode 140 in which electrode arrays have not been formed. In the state where electrode arrays have not been formed, the conducting wire pattern in the lower electrode 140 is the same as the conducting wire pattern in the upper electrode 120 in FIG. 15. However, the directions of the conducting wire patterns are different from each other by 90 degrees when the upper electrode 120 and the lower electrode 140 are laid on each other. Therefore, FIG. 16 is depicted in the state where FIG. 16 is rotated at 90 degrees with respect to FIG. 15.

Thus, the second-direction parallel bands 22 extending in the second direction $D2_3$ are formed in the upper electrode 120 while the first-direction parallel bands 41 extending in the first direction $D1_3$ are formed in the lower electrode 140. In addition, the first-direction cross bands 121 extending in the first direction $D1_3$ are formed in the upper electrode 120 while the second-direction cross bands 142 extending in the second direction $D2_3$ are formed in lower electrode 140.

Figure 17:
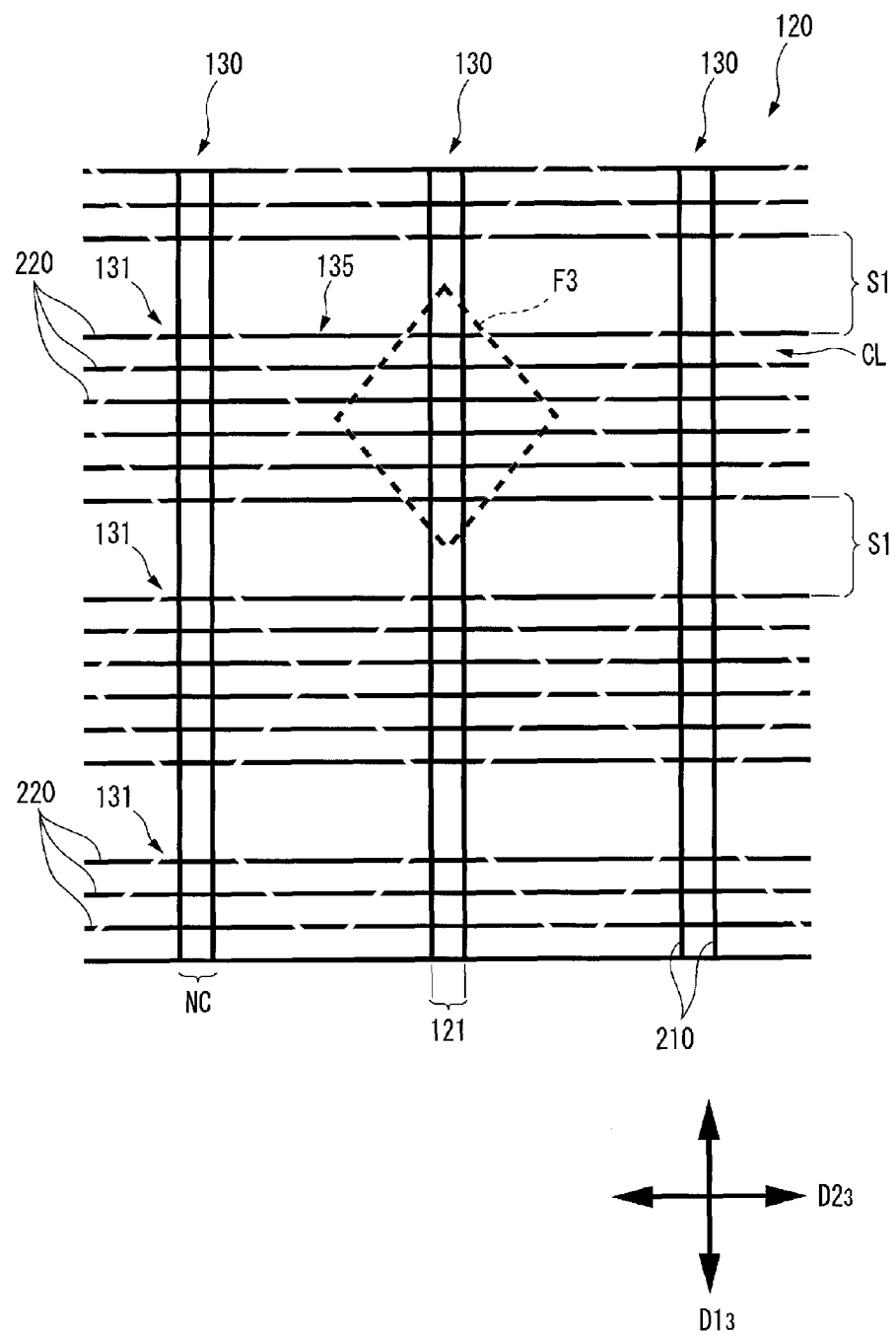
FIG. 17 A partially enlarged plan view showing the upper electrode in which the first electrode arrays have been formed.
Figure 18:
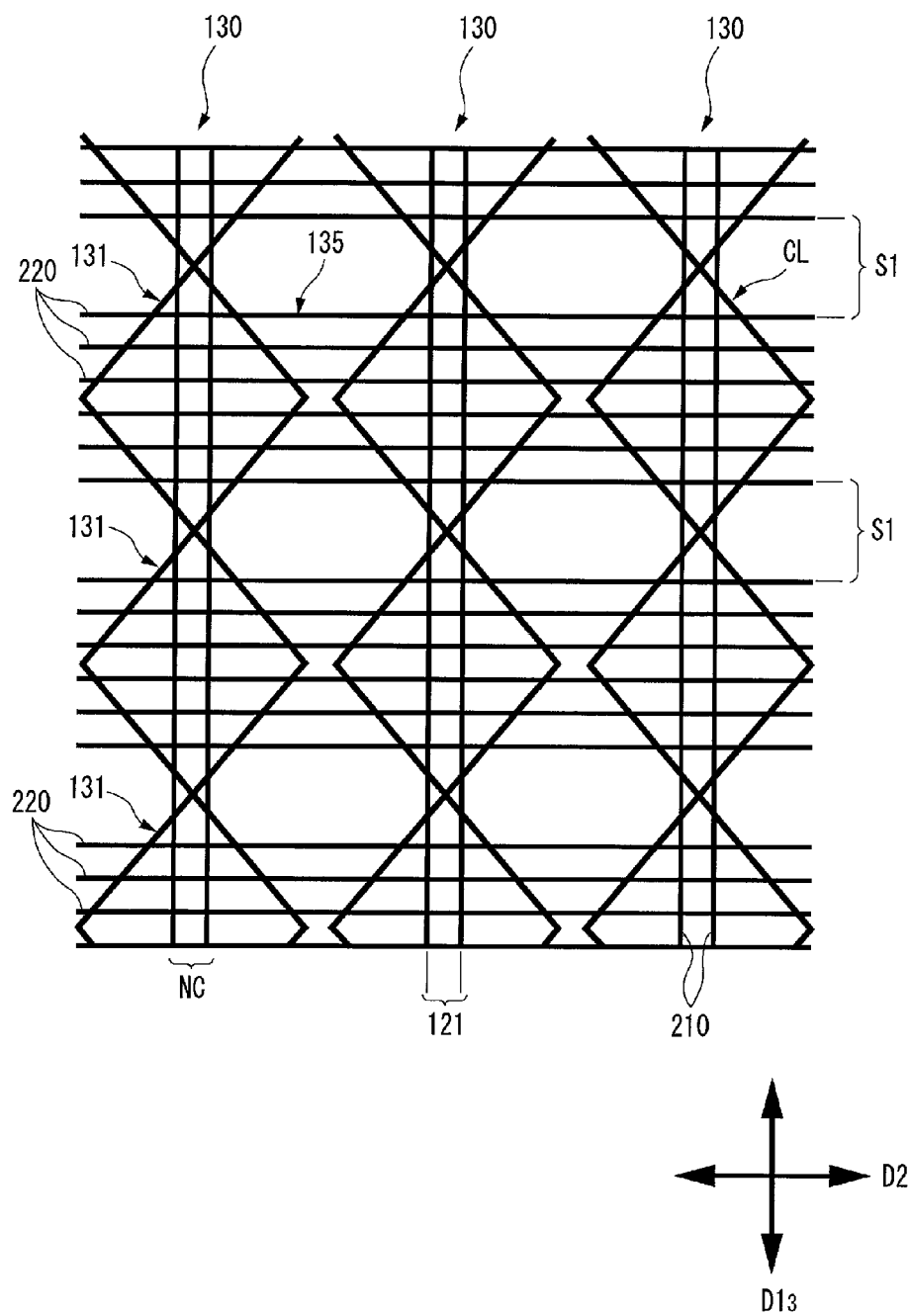
FIG. 18 A partially enlarged plan view showing the upper electrode whose disconnected portions are depicted by the solid lines.

FIG. 17 is a partially enlarged plan view of the upper electrode 120 in which first electrode arrays 130 have been formed. FIG. 18 is a plan view of the upper electrode 120 in which disconnection parts CL are depicted by the thick solid lines.

Each first electrode array 130 includes a plurality of electrode pieces 131 arrayed in the first direction $D1_3$ and each shaped like a quadrangle. Each of the electrode pieces 131 is formed by selective disconnection of parts of the pattern of the conducting wires 210 and 220 intersecting with the sides (edge line) of a rhombus F3 assumed on the first electrode 120, respectively. Specifically, the intersections between the sides of the rhombus F3 and the conducting wires 220 are disconnected while the intersections between the sides of the rhombus F3 and the conducting wires 210 are not disconnected. That is, each non-disconnection part NC constituted by the conducting wires 210 which are not disconnected when the electrode pieces 131 are sectioned is formed out of two conducting wires 210. The apexes of one diagonal corners in the rhombus F3 pass through the positions of two first-direction gaps S1 adjacent to each other on the first-direction cross band 121 respectively. The conducting wires 220 are disconnected so that each of the electrode pieces 131 can be sectioned within the rhombus F3 and a first electrode array 130 in which the electrode pieces 131 are electrically connected by the two conducting wires 210 which are not disconnected can be formed. Such first electrode arrays 130 are formed for the first-direction cross bands 121 respectively, and disposed repeatedly in the second direction $D2_3$.

Incidentally, dummy electrodes 135 which are not electrically connected to any other conducting wires but are electrically isolated are formed between the first electrode arrays 130 and 130 adjacent to each other.

Figure 19:
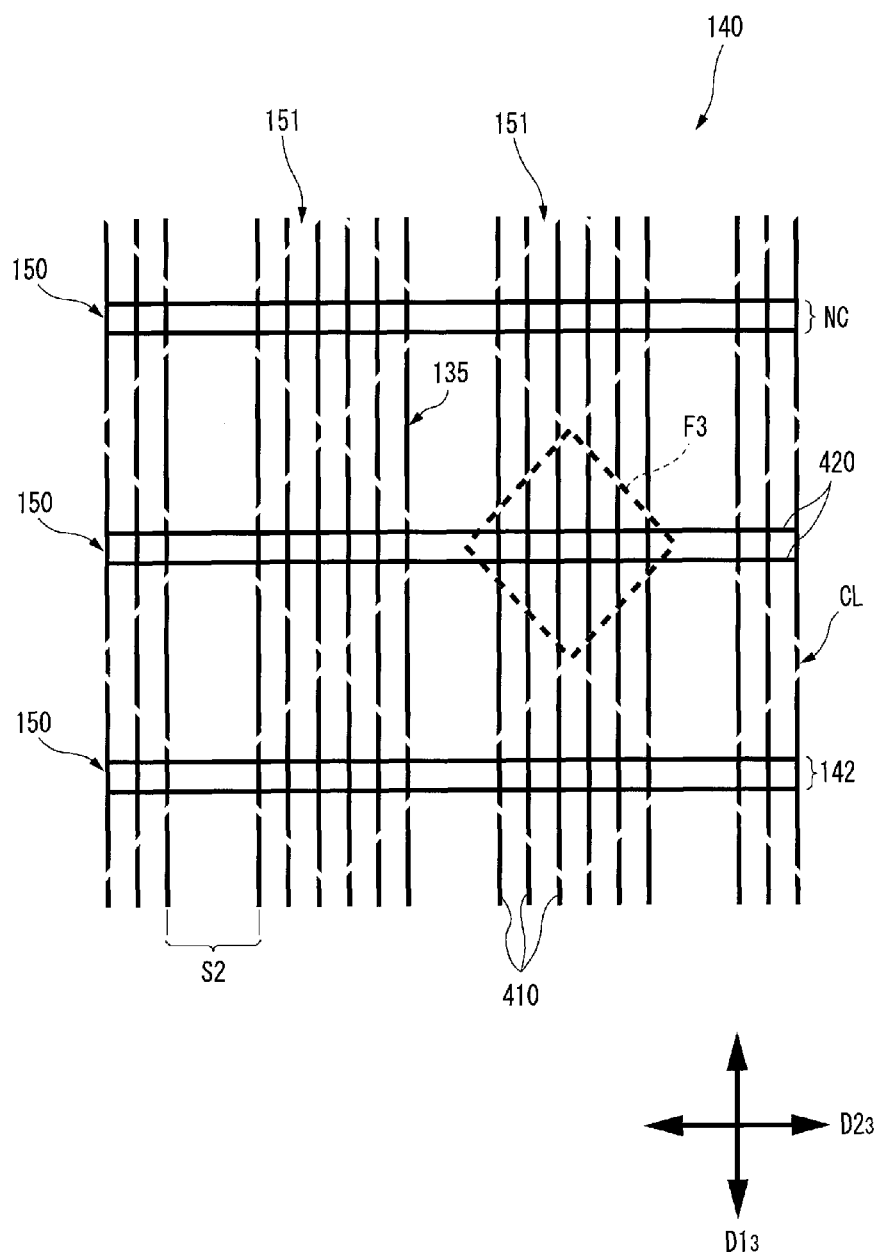
FIG. 19 A partially enlarged plan view showing the lower electrode in which the second electrode arrays have been formed.
Figure 20:
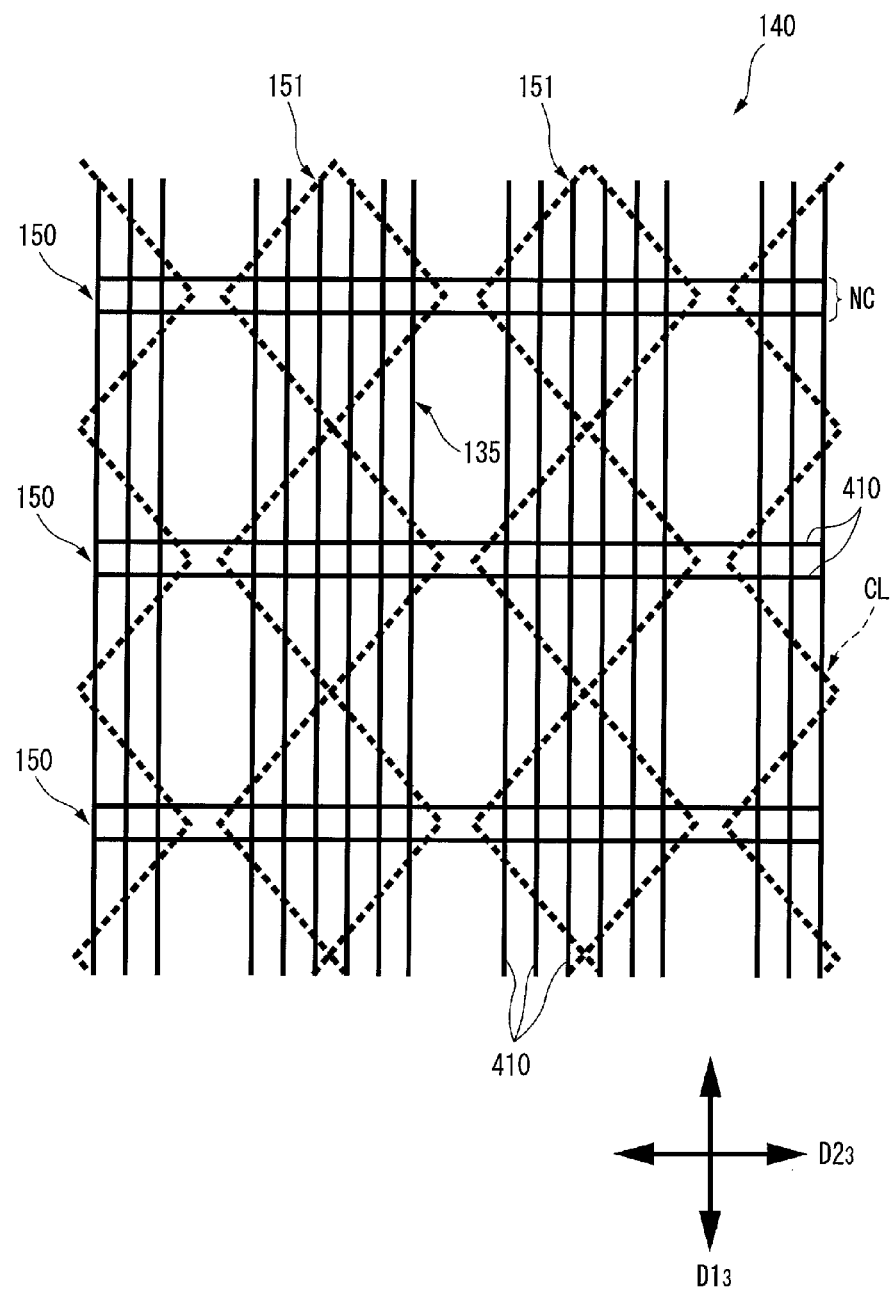
FIG. 20 A partially enlarged plan view showing the lower electrode whose disconnected portions are depicted by the broken lines.

FIG. 19 is a partially enlarged plan view of the lower electrode 140 in which second electrode arrays 150 have been formed. FIG. 20 is a plan view of the lower electrode 140 in which disconnection parts CL are depicted by the thick broken lines.

Each second electrode array 150 includes a plurality of electrode pieces 151 arrayed in the second direction $D2_3$ and each shaped like a quadrangle. Each electrode piece 151 is formed in the same manner as the aforementioned electrode piece 131, except for the array direction. That is, of the conducting wires 410 and 420 intersecting with the sides of the rhombus F3, the conducting wires 410 are disconnected but the conducting wires 420 are not disconnected. Thus, the second electrode array 150 in which the electrode pieces 151 are electrically connected by the two conducting wires 420 is formed.

Figure 21:
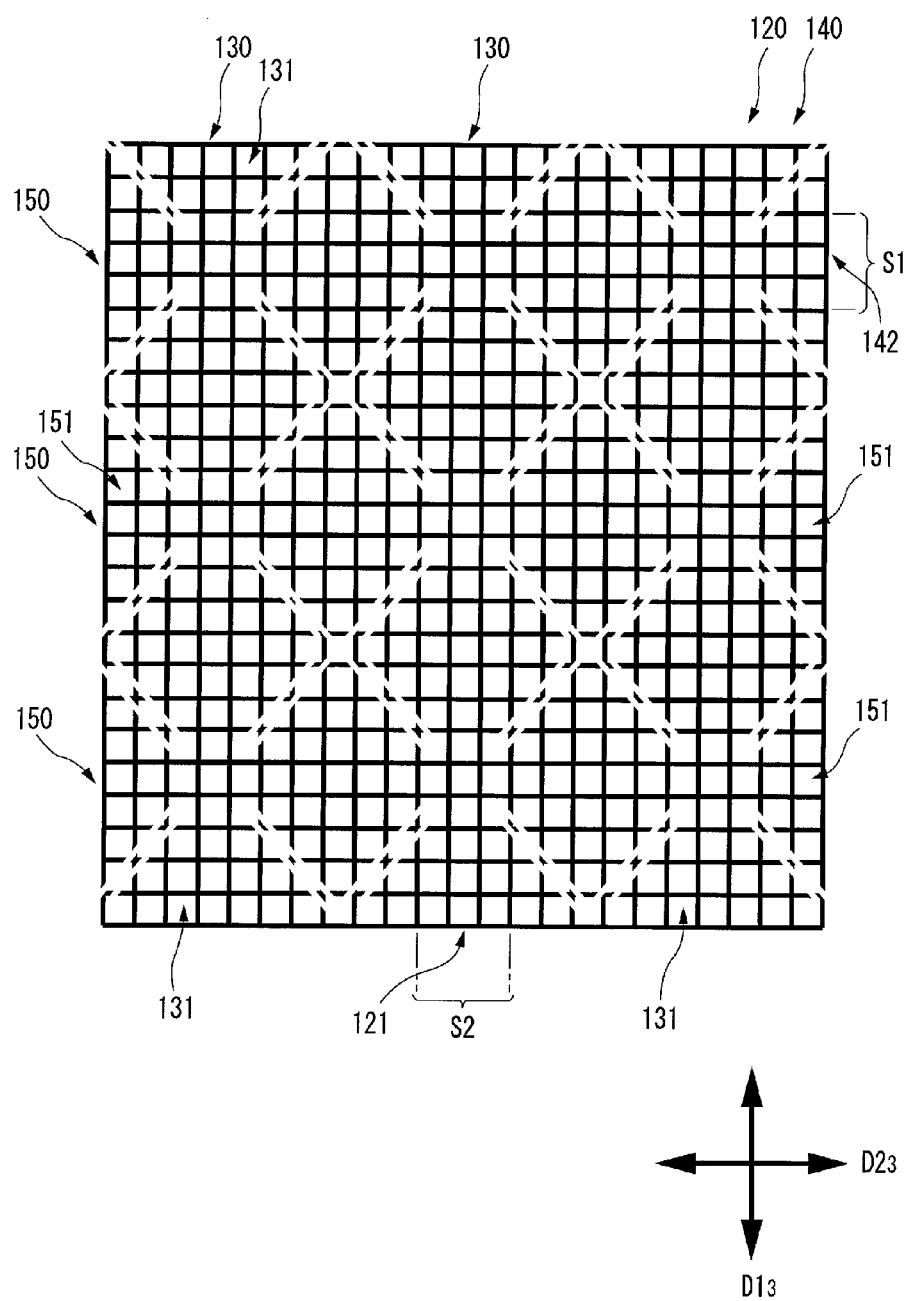
FIG. 21 A see-through view of the upper electrode and the lower electrode laid one each other.

FIG. 21 is a see-through plan view showing the state where the upper electrode 120 in FIG. 17 and the lower electrode 140 in FIG. 19 have been laid on each other. The upper electrode 120 and the lower electrode 140 are laid on each other through the dielectric layer 13 (FIG. 1) so that the array direction (the first direction $D1_3$) of the electrode pieces 131 in each first electrode array 130 is substantially perpendicular to the array direction (the second direction $D2_3$) of the electrode pieces 151 in each second electrode array 150. When the upper electrode 120 and the lower electrode 140 are laid on each other in this manner, the second-direction cross bands 142 (FIG. 19) of the lower electrode 140 are disposed on the positions of the first-direction gaps S1 of the upper electrode 120, and the first-direction cross bands 121 (FIG. 17) of the upper electrode 120 are disposed on the positions of the second-direction gaps S2 of the lower electrode 140. The first electrode arrays 130 and the second electrode arrays 150 are not superimposed on each other, and the electrode pieces 131 and the electrode pieces 151 belonging to the first electrode arrays 130 and the second electrode arrays 150 respectively are not superimposed on each other but are arrayed densely in the first direction $D1_3$ and the second direction $D2_3$. Four electrode pieces 131, 131, 151 and 151 are disposed near a point where each first-direction gap S1 intersects with each second-direction gap S2, so that the corners of the electrode pieces 131, 131, 151 and 151 can abut against one another.

Also in this embodiment, formed is a perfect grid-like pattern in which no overlapping of lines occurs except for the intersections of the conducting wires 210, 220, 410 and 420 with each other.

Figure 22:
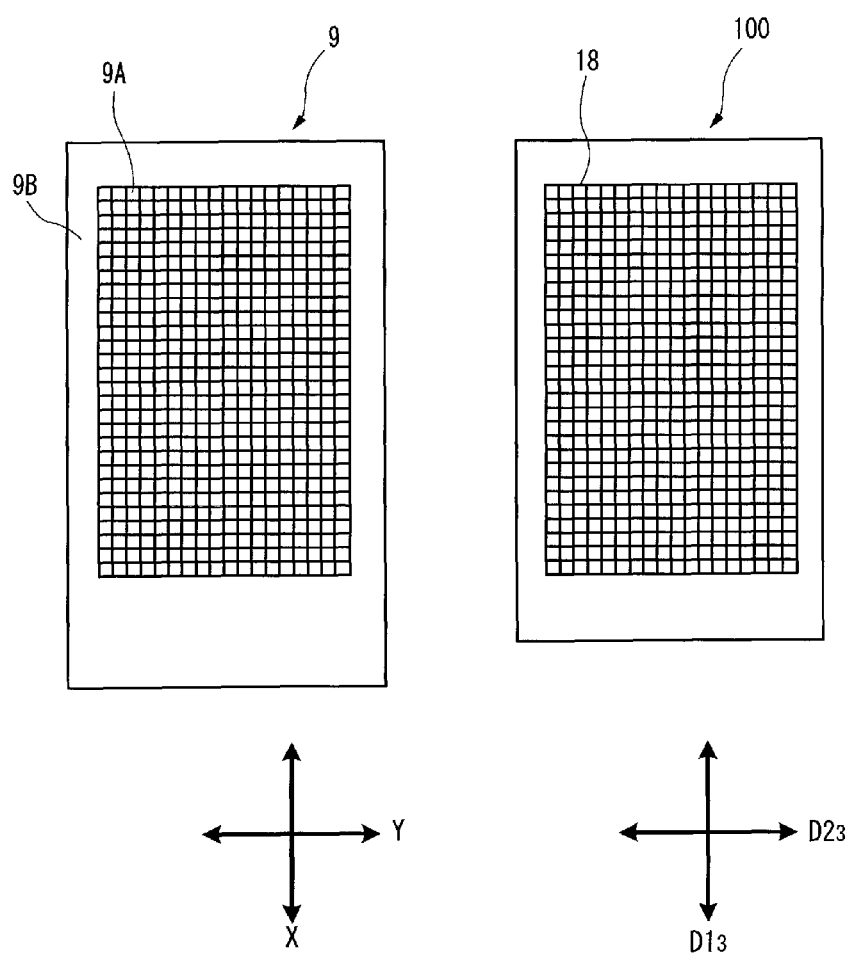
FIG. 22 A plan view showing the schematic configurations of the touch panel and a display.

FIG. 22 is a plan view showing the schematic configurations of a touch panel 100 including the upper electrode 120 and the lower electrode 140, and the display 9. The first direction $D1_3$ which is the same as the extension direction of the conducting wires 210 and 410 is parallel with the X direction of the image display portion 9A of the display 9, and the second direction $D2_3$ which is the same as the extension direction of the conducting wires 220 and 420 is perpendicular to the X direction. In addition, the second direction $D2_3$ which is the same as the extension direction of the conducting wires 220 and 420 is parallel with the Y direction of the image display portion 9A, and the first direction $D1_3$ which is the same as the extension direction of the conducting wires 210 and 410 is perpendicular to the Y direction. From this configuration, the axes of coordinates on the touch panel 100 coincide with the axes of X and Y coordinates on the display 1. Therefore, the position of a touch point can be calculated easily without requiring any processing for correcting the coordinates. In this configuration, it is preferable that the pitch of the thin wires is made an integral multiple as high as a black matrix which is a light shield portion of the display 9, so that the thin wires can be superimposed on the black matrix. As a result, moire can be prevented from occurring, and lowering in light transmittance (lowering in brightness on the display screen) can be prevented when the touch panel 100 and the display 9 are seen through. Incidentally, it is preferable that the line width of each conducting wire is made small enough to weaken the intensity of the moire.

Next, another embodiment of a touch panel for explaining a mode for carrying out the invention will be described with reference to FIG. 23 to FIG. 30. In this embodiment, a conducting wire pattern different from that in the aforementioned embodiment will be presented.

Figure 23:
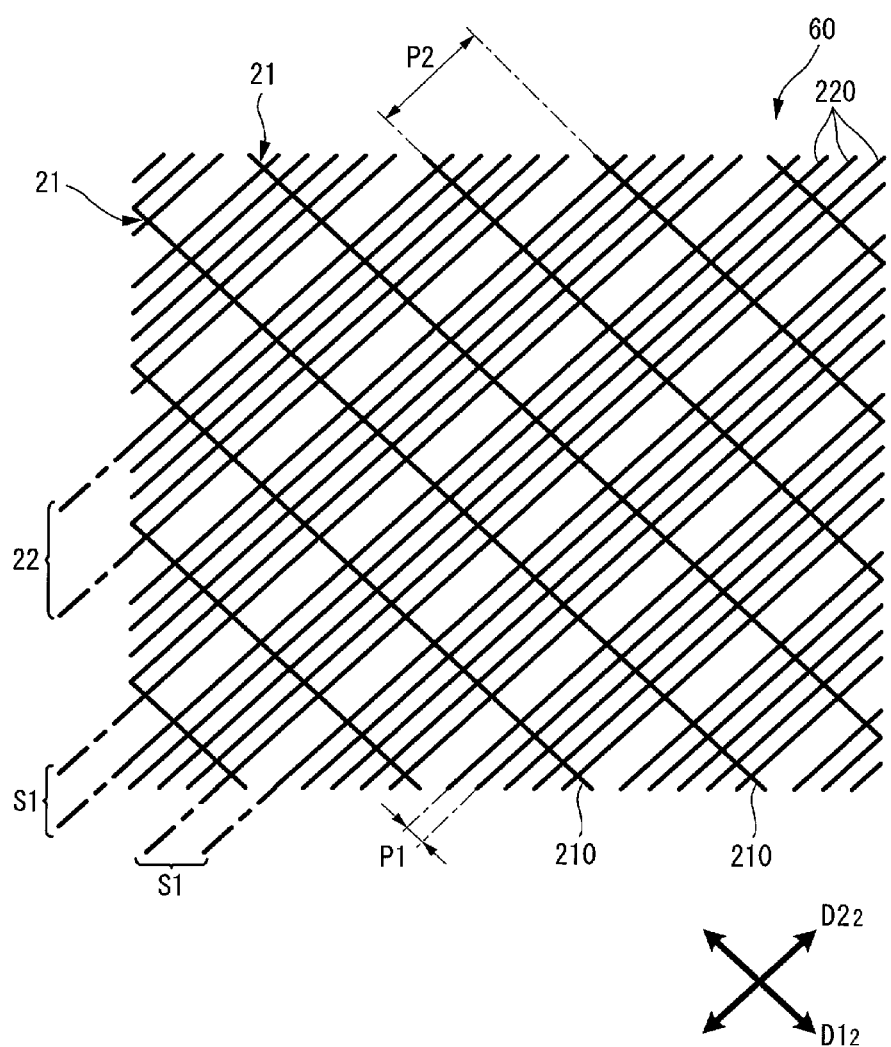
FIG. 23 A partially enlarged plan view showing an upper electrode in which first electrode arrays have not been formed, according to another embodiment for explaining a mode for carrying out the invention.

FIG. 23 is a partially enlarged plan view of an upper electrode 60 in which electrodes have not been formed. On the assumption that there are a first direction $D1_2$ and a second direction $D2_2$ intersecting with the first direction $D1_2$, a plurality of conducting wires 220 extending in parallel along the second direction $D2_2$ and a plurality of conducting wires 210 extending along the first direction $D1_2$ and intersecting with these conducting wires 220 are formed on a transparent substrate where the upper electrode 60 is formed, in substantially the same manner as in the upper electrode 20 (FIG. 2). The number of the conducting wires, the intersecting angle of the conducting wires, the intervals among the conducting wires, etc. are different from those in the upper electrode 20 described previously. Also in this embodiment, second-direction parallel bands 22 including the conducting wires 220 and first-direction cross bands 21 constituted by the conducting wires 210 are formed in substantially the same manner as in the aforementioned embodiment.

Figure 24:
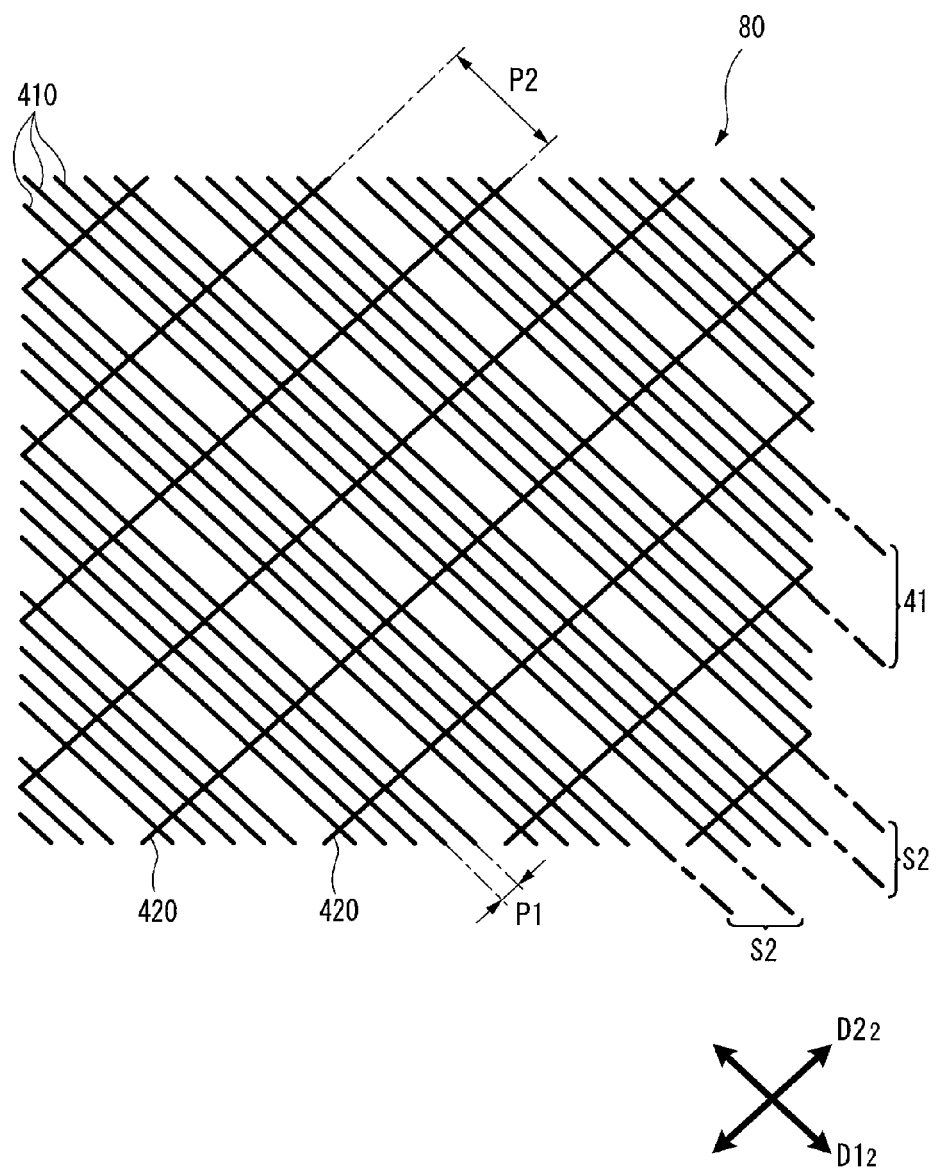
FIG. 24 A partially enlarged plan view showing a lower electrode in which second electrode arrays have not been formed.

FIG. 24 is a partially enlarged plan view of a lower electrode 80 in which electrode arrays have not been formed. A pattern of conducting wire having a mirror-image relationship to the pattern of conducting wires in the first electrode 60 in FIG. 23 is formed on a transparent substrate in which the lower electrode 80 is formed. A mirror-image relationship is established between the conducting wire pattern of the upper electrode 60 and the conducting wire pattern of the lower electrode 80 when the up/down direction in FIGS. 23 and 24 is regarded as a binding direction. That is, when a center line extending in the up/down direction of the paper is set, the conducting wire pattern of the upper electrode 60 and the conducting wire pattern of the lower electrode 80 are formed symmetrically with respect to the center line.

The upper electrode 60 and the lower electrode 80 are laid on each other in the state where the conducting wire patterns are rotated at an angle of about 90 degrees relatively to each other. Therefore, second-direction parallel bands 22 including a plurality of conducting wires 220 extending in the second direction $D2_2$ are formed in the upper electrode 60 while first-direction parallel bands 41 including a plurality of conducting wires 410 extending in the first direction $D1_2$ are formed in the lower electrode 80. In addition, conducting wires 210 extending in the first direction $D1_2$ are formed in the upper electrode 60 while conducting wires 420 extending in the second direction $D2_2$ are formed in the lower electrode 80.

Figure 25:
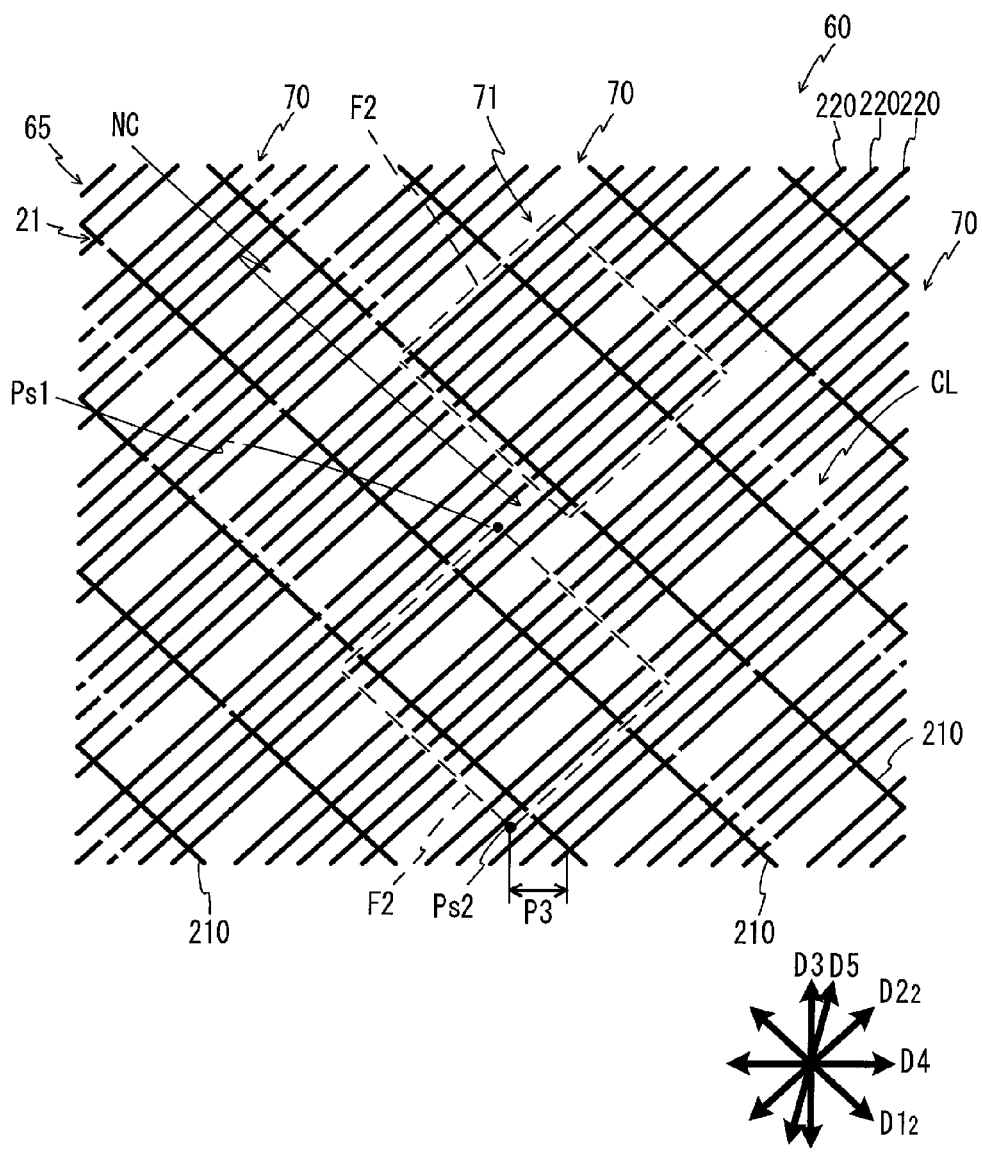
FIG. 25 A partially enlarged plan view showing the upper electrode in which the first electrode arrays have been formed.
Figure 26:
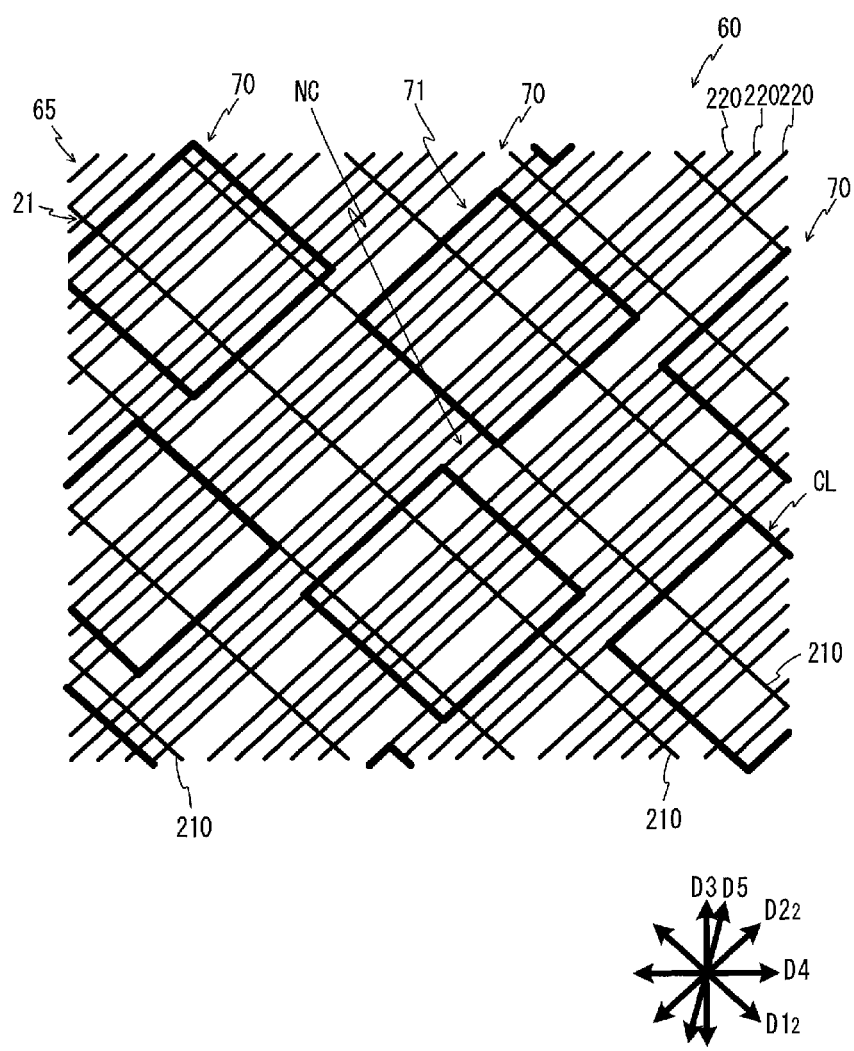
FIG. 26 A partially enlarged plan view showing the upper electrode whose disconnected portions are depicted by the solid lines.

FIG. 25 is a partially enlarged plan view of the upper electrode 60 in which first electrode arrays 70 have been formed. FIG. 26 is a plan view of the upper electrode 60 in which disconnection parts CL are depicted by the thick solid lines.

Each first electrode array 70 has a plurality of electrode pieces 71 arrayed in a direction intersecting with both the first direction $D1_2$ and the second direction D2 and each shaped like a quadrangle. Each of the electrode pieces 71 is formed by selective disconnection of parts of the pattern of the conducting wires 210 and 220 intersecting with the sides (edge line) of a quadrangle F2 assumed on the upper electrode 60.

The quadrangle F2 passes through a point Ps1 on the substrate where the upper electrode 60 is formed, and another point Ps2 on the substrate spaced apart from the point Ps1 in a third direction D3 intersecting with both the first direction $D1_2$ and the second direction $D2_2$. The intersections between the sides of the quadrangle F2 and the conducting wires 210 are disconnected while the intersections between the sides of the quadrangle F2 and the conducting wires 220 are also disconnected except for portions (non-disconnection parts NC) near the point Ps1 and the point Ps2. Thus, each of the electrode pieces 71 is sectioned within the quadrangle F2 and the first electrode array 70 in which the electrode pieces 71 are electrically connected by the non-disconnection parts NC is formed. Each non-disconnection part NC is formed to include parts of the conducting wires 220.

Between the positions of the electrode pieces 71 adjacent to each other in a fourth direction D4 perpendicular to the third direction D3, there is a difference of a distance P3. As a result, the array direction of the electrode pieces 71 is a fifth direction D5 in which the third direction D3 and the distance P3 of the fourth direction D4 are combined.

Incidentally, dummy electrodes 65 which are not electrically connected to any other conducting wires but are electrically isolated are formed between the first electrode arrays 70 and 70 adjacent to each other.

Figure 27:
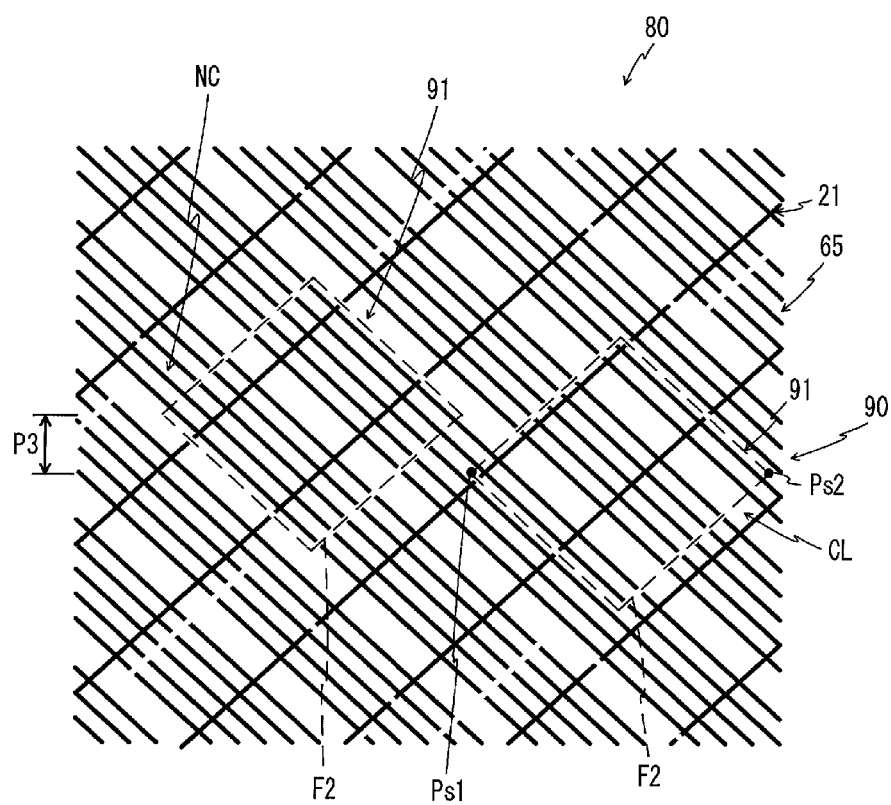
FIG. 27 A partially enlarged plan view showing the lower electrode in which the second electrode arrays have been formed.
Figure 27:
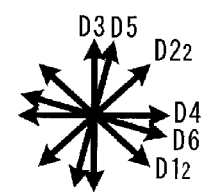
Figure 28:
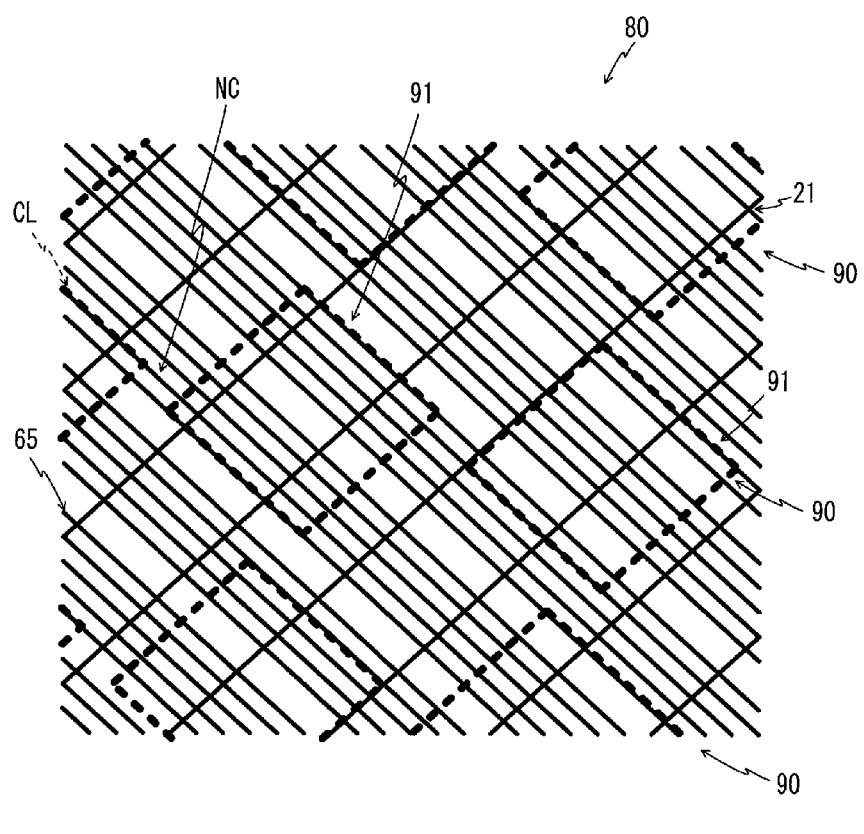
FIG. 28 A partially enlarged plan view showing the lower electrode whose disconnected portions are depicted by the broken lines.

FIG. 27 is a partially enlarged plan view of the lower electrode 80 in which second electrode arrays 90 have been formed. FIG. 28 is a plan view of the lower electrode 80 in which disconnection parts CL are depicted by the thick broken lines.

Each of the second electrode arrays 90 includes a plurality of second electrode pieces 91 arrayed in a direction intersecting with all the first direction $D1_2$, the second direction $D2_2$, the third direction D3 and the fourth direction D4 and each shaped like a quadrangle. Each second electrode piece 91 is formed in the same manner as the aforementioned electrode piece 71, except for the array direction. That is, the quadrangle F2 passes through a point Ps1 on the substrate, and another point Ps2 on the substrate spaced apart from the point Ps1 in the fourth direction D4 intersecting with all the first direction $D1_2$, the second direction $D2_2$ and the third direction D3. The intersections between the sides of the quadrangle F2 and the conducting wires 420 are disconnected while the intersections between the sides of the quadrangle F2 and the conducting wires 410 are also disconnected except for non-disconnection parts NC which are parts near the point Ps1 and the point Ps2. Between the positions of the electrode pieces 91 adjacent to each other in the third direction D3, there is a difference of the distance P3. As a result, the array direction of the electrode pieces 91 is a sixth direction in which the fourth direction D4 and the distance P3 of the third direction D3 are combined.

Figure 29:
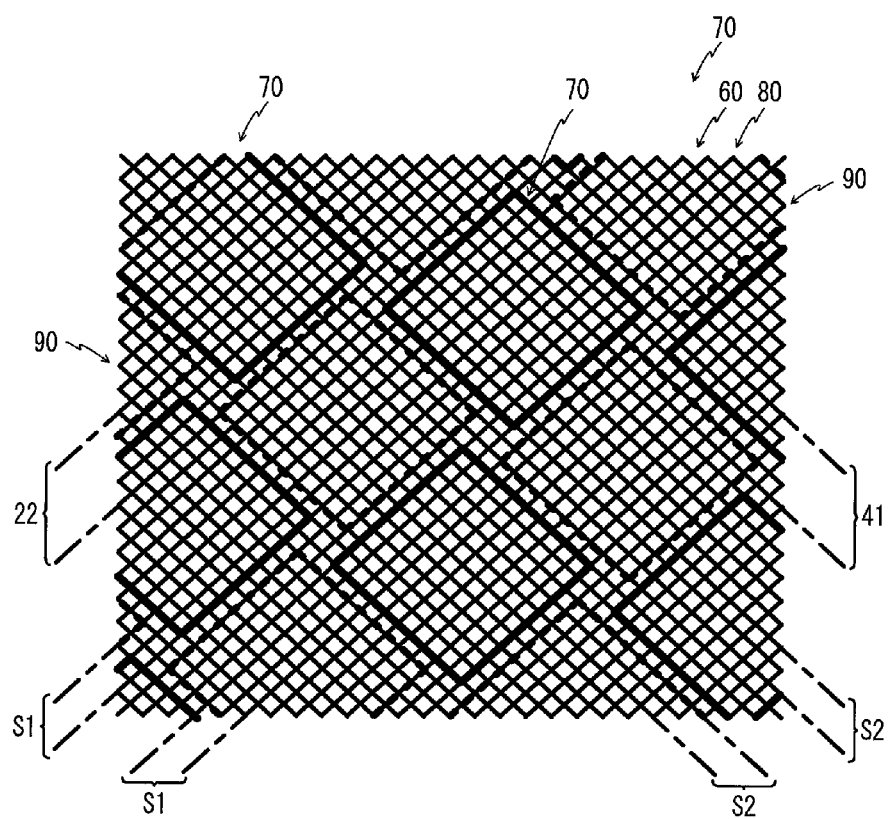
Figure 29:
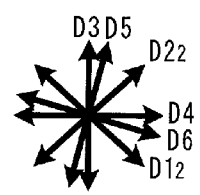

FIG. 29 is a see-through plan view showing the state where the upper electrode 60 in FIG. 25 and the lower electrode 80 in FIG. 27 have been laid on each other. The disconnection parts CL are depicted by the thick lines. The upper electrode 60 and the lower electrode 80 are laid on each other through the dielectric layer 13 (FIG. 1) so that the array direction (the fifth direction D5) of the electrode pieces 71 in each first electrode array 70 is perpendicular to the array direction (the sixth direction D6) of the electrode pieces 91 in each second electrode array 90. When the upper electrode 60 and the lower electrode 80 are laid on each other in this manner, the conducting wires 420 (FIG. 14) of the lower electrode 80 are disposed in the positions of the first-direction gaps S1 of the upper electrode 60, and the conducting wires 210 (FIG. 13) of the upper electrode 60 are disposed in the positions of the second-direction gaps S2 of the lower electrode 40. The first electrode arrays 70 and the second electrode arrays 90 are not superimposed on each other, and the electrode pieces 31 of the first electrode arrays 30 and the electrode pieces 51 of the second electrode arrays 50 are not superimposed on each other but are arrayed densely in the first direction $D1_2$ and the second direction $D2_2$. Four electrode pieces 71, 71, 91 and 91 are disposed near a point where a non-disconnection part NC in the upper electrode 60 intersects with a non-disconnection part NC in the lower electrode 80, so that the corners of the electrode pieces 71, 71, 91 and 91 can abut against one another.

Also in this embodiment, formed is a perfect grid-like pattern in which no overlapping of lines occurs except for the intersections of the conducting wires 210, 220, 410 and 420 with each other.

Figure 30:
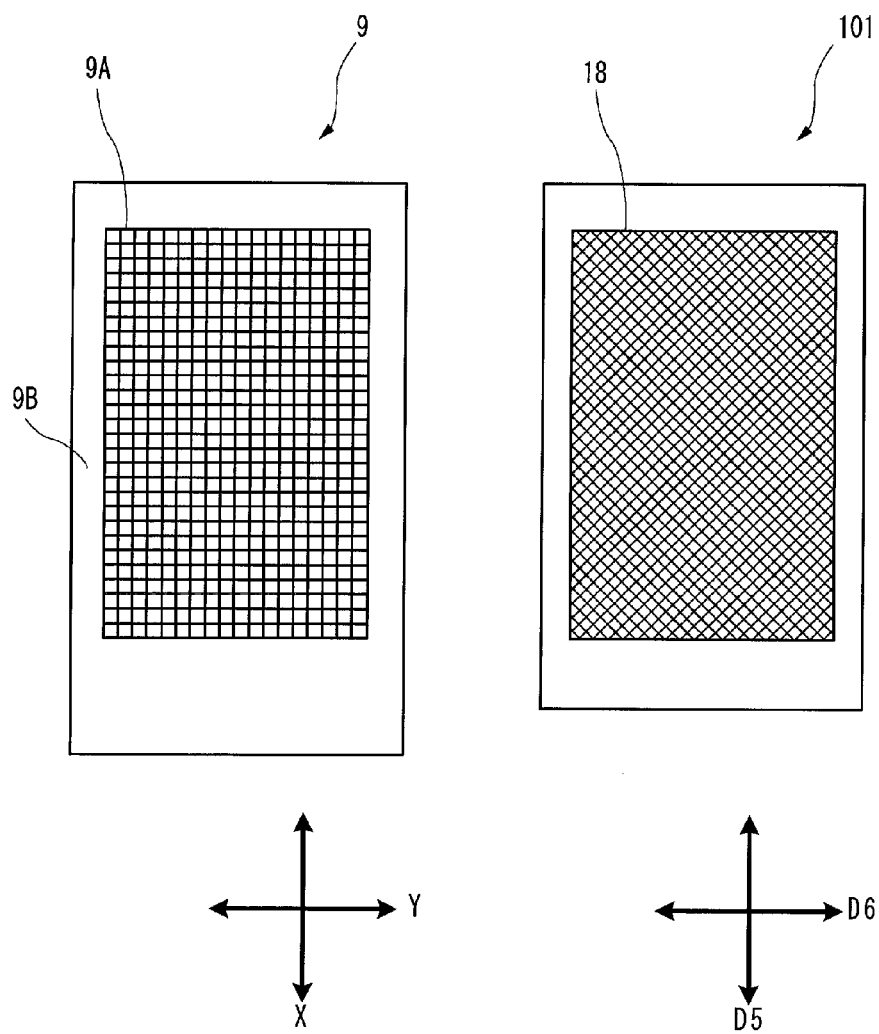
FIG. 30 A plan view showing the schematic configurations of the touch panel and a display.

FIG. 30 is a plan view showing the schematic configurations of a touch panel 101 including the first and second electrodes 60 and 80, and the display 9. The fifth direction D5 is parallel with the X direction of the image display portion 9A, and the sixth direction D6 is perpendicular to the X direction. In addition, the sixth direction D6 is parallel with the Y direction of the image display portion 9A, and the fifth direction D5 is perpendicular to the Y direction. From this configuration, the axes of coordinates on the touch panel 101 coincide with the axes of X and Y coordinates on the display 9. Therefore, the position of a touch point can be calculated easily without requiring any processing for correcting the coordinates.

On this occasion, the first direction D1 and the second direction D2 which are the extension directions of the conducting wires have inclination angles with both the X direction and the Y direction which are the array directions of the pixel electrodes. As a result, the metal thin wires of the touch panel 1 can be prevented from having parallelism with sides (edges) forming the outline of the structure of the pixel electrodes or the shape of the internal structure thereof etc. or from approaching the sides at an angle close to the parallelism. Thus, the occurrence of interference fringes can be suppressed.

An embodiment of a resistive touch panel for explaining a mode for carrying out the present invention will be described with reference to FIG. 31 to FIG. 34.

Figure 31:
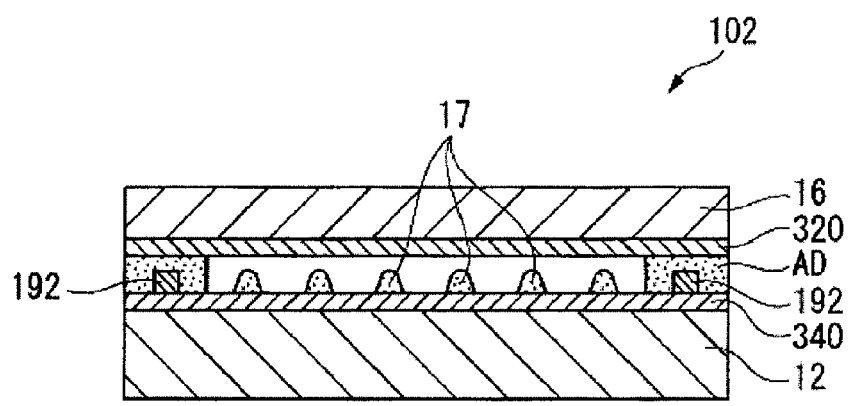
FIG. 31 A sectional view of a resistive touch panel which is another embodiment explaining a mode for carrying out the invention.

FIG. 31 schematically shows a sectional view of an embodiment of a resistive touch panel according to the present invention. A touch panel 102 has an upper electrode 320 serving as a first electrode and disposed on the side to be touched by a fingertip, a pen or the like, and a lower electrode 340 serving as a second electrode and disposed on the side of a display 9 (FIG. 9) serving as an image display apparatus. The lower electrode 340 formed on an insulating transparent substrate 12, and the upper electrode 320 formed on a flexible insulating transparent film 16 are pasted to each other with interposition of insulating spacers 17 by an adhesive layer AD provided along the four sides of each electrode. The spacers 17 are formed on the lower electrode 340 so as to lie like dots in plan view.

Figure 32:
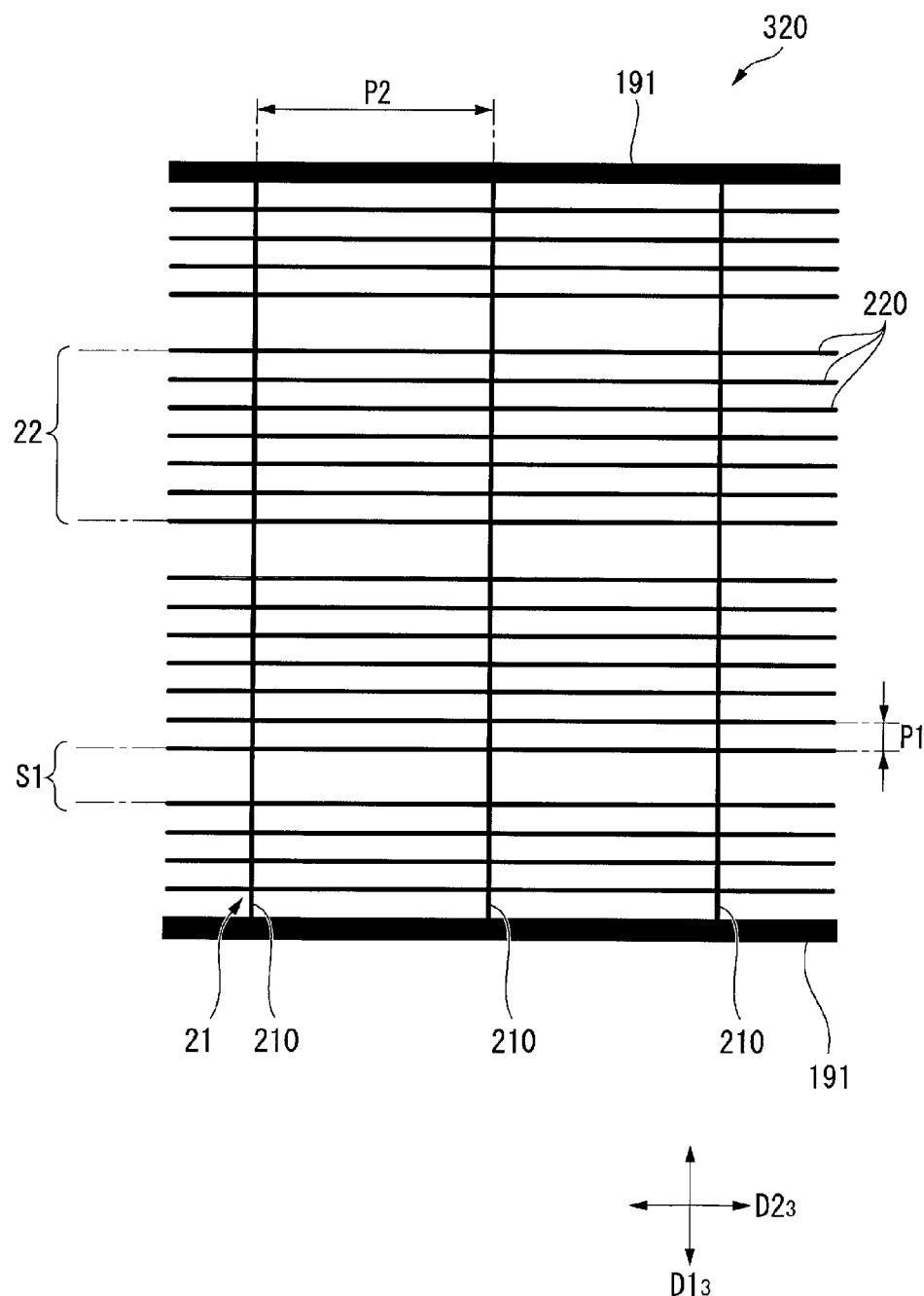
FIG. 32 A plan view schematically showing an upper electrode.
Figure 33:
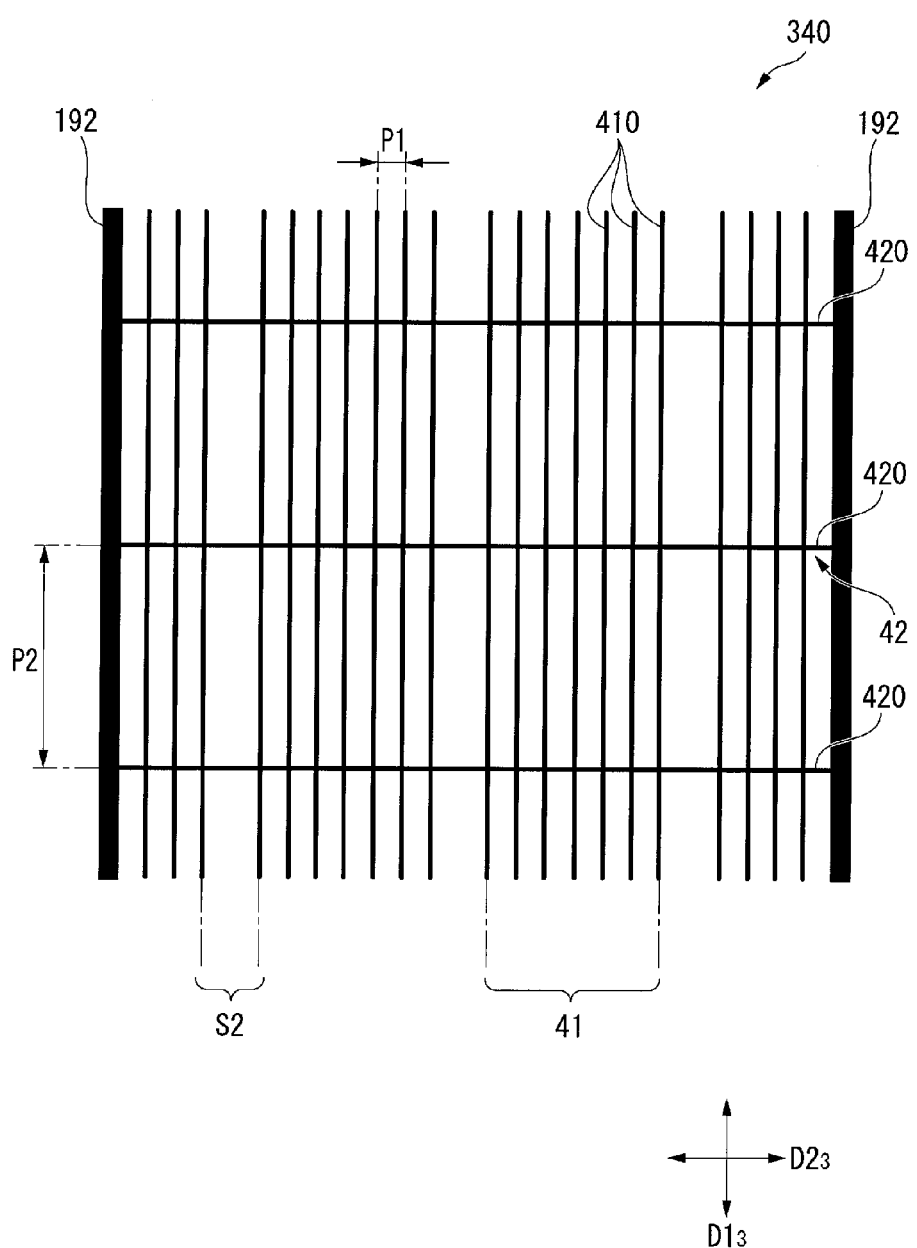
FIG. 33 A plan view schematically showing a lower electrode.
Figure 34:
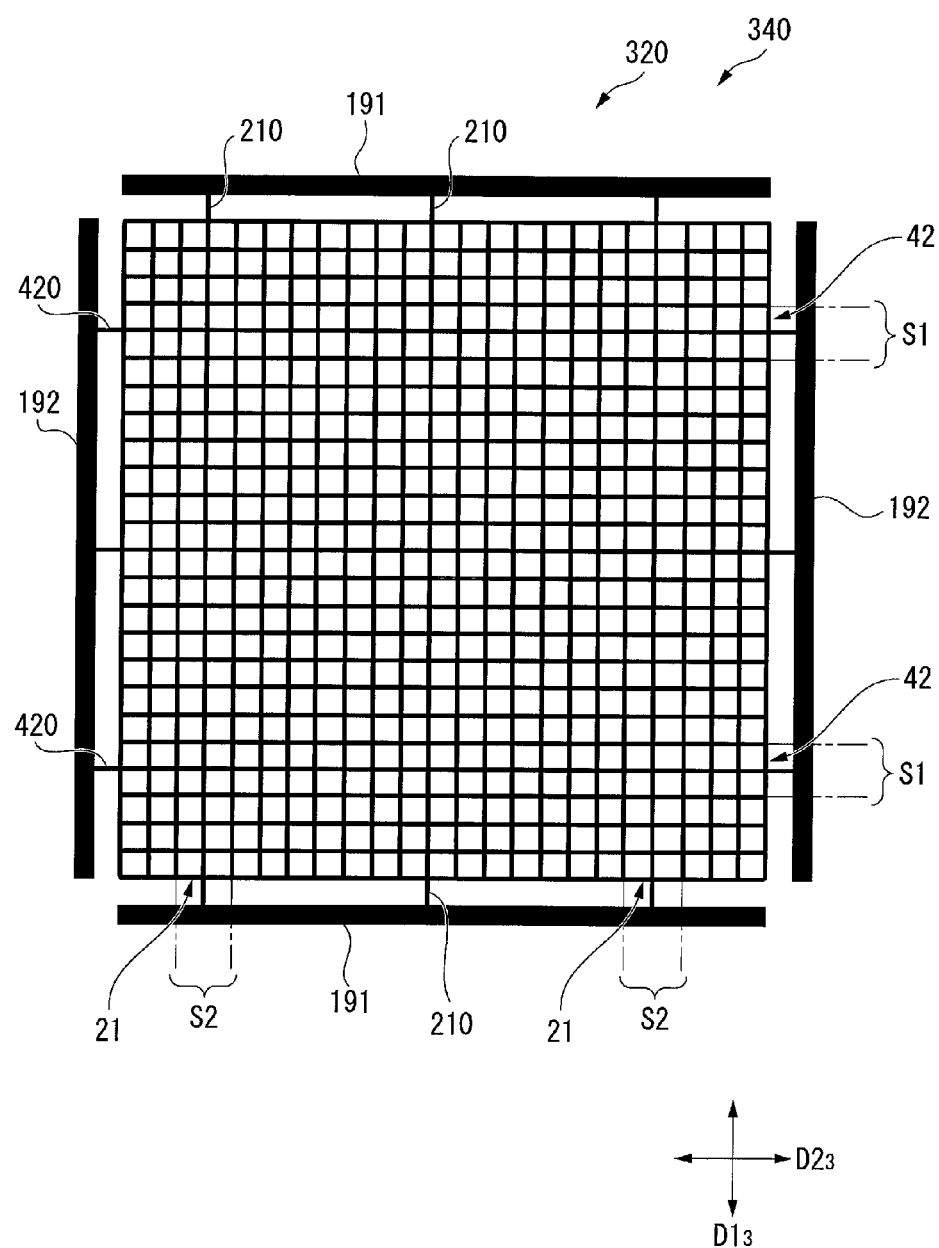
FIG. 34 A see-through view of the upper electrode and the lower electrode laid on each other.

FIG. 32 is a schematic plan view of the upper electrode 320. A plurality of conducting wires 220 (lateral lines) extending in parallel along a second direction $D2_3$ which is a lateral direction of the paper, and a plurality of conducting wires 210 (longitudinal lines) extending perpendicularly to these conducting wires 220 and along a first direction $D1_3$ are formed on the transparent film 16 where the upper electrode 320 is formed. Here, FIG. 32 to FIG. 34 depict the conducting wires the number of which is made smaller than the real one for the sake of easiness to understand. The real number of conducting wires depends on a number large enough to obtain practical accuracy for detecting positions in the touch panel. Also in this embodiment, second-direction parallel bands 22 including the plurality of conducting wires 220 are formed repeatedly with interposition of first-direction gaps S1 in substantially the same manner as in the aforementioned embodiment. In addition, first-direction cross bands 21 including the conducting wires 210 are also formed in the same manner as in the aforementioned first-direction cross bands 21.

A pair of upper electrode bus bars 191 and 191 are formed in the opposite end portions, in the first direction $D1_3$, of the transparent film where the upper electrode 320 is formed so as to extend in the first direction $D2_3$ respectively. Each conducting wire 210 of the first-direction cross bands 21 is bonded and electrically connected to the upper electrode bus bars 191 and 191 at the opposite ends thereof. The bus bars 191 and 191 are connected to a not-shown DC power supply, and, for example, a voltage of several V is applied between the bas bars 191 and 191.

Conductive paste of metal such as gold, silver, copper or nickel, carbon, etc. may be used for the bus bars 191 and 191. A printing method such as screen printing, offset printing, gravure printing or flexo printing, a photoresist method, a brush coating method, etc. may be used as a method for forming the bus bars 191 and 191.

According to this embodiment, disconnection parts are not formed in the conducting wire pattern as in the aforementioned embodiments. The conducting wire pattern according to this embodiment is not sectioned into a plurality of electrode pieces or electrode arrays consisting of the electrode pieces. That is, the conducting wires 210 and 220 intersecting with each other and having a grid-like shape are electrically connected with each other so as to form an electrode.

FIG. 33 is a schematic plan view of the lower electrode 340. The conductive pattern of the lower electrode 340 is the same as the conductive pattern of the upper electrode 320 in FIG. 32. FIG. 33 is illustrated as a state rotated at 90 degrees with respect to FIG. 32.

Thus, first-direction parallel bands 41 extending in the first direction $D1_3$, and second-direction cross bands 42 extending in the second direction $D2_3$ are formed in the lower electrode 340.

A pair of lower electrode bus bars 192 and 192 are formed in the opposite end portions, in the second direction $D2_3$, of the transparent substrate where the lower electrode 340 is formed, so as to extend in the first direction $D1_3$. Each conducting wire 420 of the second-direction cross bands 42 is bonded and electrically connected to the lower electrode bus bars 192 and 192 at the opposite ends thereof. These lower electrode bus bars 192 and 192 are formed in the same manner as the upper electrode bus bars 191 and 191, and, for example, a voltage of several V is applied between the lower electrode has bars 192 and 192 by a not-shown DC power supply.

In addition, though not shown in FIG. 33, a large number of insulating spacers 17 (FIG. 31) are formed on the lower electrode 340 so as to lie like dots. These spacers 17 project toward the upper electrode 320 so as to prevent the upper electrode 320 and the lower electrode 340 from touching each other and to form a space between the upper electrode 320 and the lower electrode 340. Incidentally, the spacers 17 may be formed on the upper electrode 320.

The spacers 17 may be obtained in such a manner that transparent photo-curable resin such as acrylate resin such as melamine acrylate resin, urethane acrylate resin, epoxy acrylate resin, methacrylate acrylic resin or acrylate acrylic resin, polyvinyl alcohol resin, etc. is formed into minute dot-like shapes by a photo process. Alternatively, a large number of minute dots may be formed as spacers by a printing method.

FIG. 34 is a see-through plan view showing the state where the upper electrode 320 in FIG. 32 and the lower electrode 340 in FIG. 33 have been laid on each other. Incidentally, the spacers 17 and the adhesive layer AD are not shown in FIG. 34. When the upper electrode 320 and the lower electrode 340 are laid on each other in this manner, the second-direction cross bands 42 (FIG. 33) of the lower electrode 340 are disposed in the positions of the first-direction gaps S1 of the upper electrode 320, and the first-direction cross bands 21 (FIG. 32) of the upper electrode 320 are disposed in the positions of the second-direction gaps S2 of the lower electrode 340. Thus, formed is a perfect grid-like pattern in which no overlapping of lines occurs except for the intersections of the conducting wires 210, 220, 410 and 420 with each other.

When the back surface of the upper electrode 320 (the touch-side surface of the transparent film 12 where the upper electrode 320 is formed) is touched by a fingertip, a pen or the like in the touch panel 102 configured thus, the upper electrode 320 and the lower electrode 340 are brought into contact and electrically connected to each other in a position (touch position) where the spacers 17 are absent. On this occasion, the X coordinate of the touch position is measured based on the voltage gradient in the first direction $D1_3$ at the time of voltage application between the bus bars 191 and 191 of the upper electrode 320, while the Y coordinate of the touch position is measured based on the voltage gradient in the second direction $D2_3$ at the time of voltage application between the bus bars 192 and 192 of the lower electrode 340. Specifically, no voltage is applied to the lower electrode 340 when the X coordinate is measured. Contact and electric continuity in the touch position produces a divided voltage from the voltage applied between the upper electrode bus bars 191 and 191, and the divided voltage is outputted as potential between the bus bars 192 and 192 of the lower electrode 340. On the other hand, no voltage is applied to the upper electrode 320 when the Y coordinate is measured. Contact and electric continuity in the touch position produces a divided voltage from the voltage applied between the lower electrode bus bars 192 and 192, and the divided voltage is outputted as potential between the bus bars 191 and 191 of the upper electrode 320. The XY coordinates of the touch position are measured from these divided voltages, the distances between the bus bars and the voltages applied between the bus bars, respectively.

Also in this embodiment, the coordinates on the touch panel coincide with the coordinates on the display in the same manner as in the embodiment described with respect to FIG. 15 to FIG. 22. Thus, conversion of the coordinates can be dispensed with.

Incidentally, the total electric resistance of all the conducting wires 210 formed in the conducting wire pattern formation region of the upper electrode 320, and the total electric resistance of all the conducting wires 420 formed in the conducting wire pattern formation region of the lower electrode 340 are each preferably in a range of from $100\Omega$ to $5 k\Omega$, particularly preferably in a range of from $200\Omega$ to $2 k\Omega$.

In addition, the upper electrode bus bars 191 and 191 and the lower electrode bus bars 192 and 192 are hidden in positions which are outside a touch sensor region which is the conducting wire pattern formation region, so that the upper electrode bus bars 191 and 191 and the lower electrode bus bars 192 and 192 cannot be recognized visually by an operator due to a not-shown display window frame portion or the like. It is therefore possible to make the line widths of the bus bars 191 and 192 sufficiently larger than that of each conducting wire. Thus, the potential drop caused by the bus bars when the touch position is detected can be ignored.

Although the touch panel 102 based on 4-wire type resistive technology is illustrated in this embodiment, the invention can be applied to another resistive technology of a 4-wire type, a 6-wire type, a 7-wire type, an 8-wire type, or the like.

Conductive materials and electrode formation methods which can form the conducting wire patterns of the upper electrode and the lower electrode described above will be described in the following paragraph [1].

[1] It is preferable that the upper electrode and the lower electrode are electrodes using conductive thin wires, and metal or alloy with low resistance and high conductivity is used. Examples of such metals may include copper, silver, gold, platinum, palladium, nickel, tin, aluminum, cobalt, rhodium, iridium, iron, ruthenium, osmium, manganese, molybdenum, tungsten, niobium, tantel, titanium, bismuth, antimony, lead, etc. Of these, copper, silver, gold, platinum, palladium, nickel, tin, aluminum, and alloys of them are preferable because of their superior conductivity. Here, it is preferable that similar materials as to specific resistance are used for the upper electrode and the lower electrode. Fundamentally, the upper electrode and the lower electrode are formed out of the same conductive material, but may be formed out of different conductive materials.

The following modes [2] to [4] may be used for forming electrodes out of these metals or alloys.

[2] Use as metal foil or a thin film. To be used as a thin film, first, a metal thin film is formed on a substrate out of the aforementioned metal or alloy by a vacuum deposition method, a sputtering method, an ion plating method, or the like, or by a plating method or pasting of metal foil, or the like. Next, the following patterning is performed on the metal thin film so as to form electrodes. When the aforementioned pattern is formed by photo-etching, a photoresist film is formed on the metal thin film, exposed to light using a photo-mask, and developed with a developer to form a pattern in the resist film. This is etched with an etchant, and the resist film is separated and removed to form a pattern out of thin metal wires. Alternatively, when the pattern is formed by printing resist, a pattern of a resist film is printed on the metal thin film by a method of screen printing, gravure printing, inkjet printing or the like, so as to etch the metal thin film other than the portion coated with the resist by the etchant, and the resist film is separated to form a pattern of metal thin wires.

[3] A method for printing the aforementioned pattern using ink (or paste) containing conductive nanoparticles. In addition to nanoparticles of the aforementioned metals, carbon may be used as the conductive nanoparticles. It is preferable that the conductive nanoparticles are particles containing gold, silver, palladium, platinum, copper, carbon, or a mixture of those. The average particle size of the nanoparticles is not larger than 2 µm but is preferably 200 to 500 nm. In order to form the pattern, it is preferable that the average particle size of the nanoparticles is smaller than that of micron particles used in the background art. A screen printing method or a gravure printing method is used as the pattern printing.

The conductive material containing ink (or paste) may be not metal particles but conductive fibers. The conductive fibers designated in this invention include metal wires, fibrous materials called nanowires, hollow-structure tubes, and nanotubes. The average minor axial length (that may be referred to as "average minor axial diameter" or "average diameter") of the metal nanowires is preferably not larger than 100 nm, more preferably 1 nm to 50 nm, further preferably 10 nm to 40 nm, particularly preferably 15 nm to 35 nm. To form a conductive layer using the conductive fibers, the conductive layer may be, for example, formed in combination of techniques disclosed in JP-A-2009-215594, JP-A-2009-242880, JP-A-2009-299162, JP-A-2010-84173, JP-A-2010-87105, and JP-A-2010-86714.

[4] A method using a silver halide photographic photosensitive material for use in photograph. In the method, pattern exposure is performed on the material, and developing treatment and fixing treatment are then performed to obtain a conductive thin wire pattern with developed silver. The method for obtaining a conductive thin wire pattern in the invention includes the following three forms on the basis of the photosensitive material and the form of the developing treatment. (a) A form in which a photosensitive silver halide black-and-white sensitive material containing no physical development nucleus is chemically developed or thermally developed to form a metal silver portion on the photosensitive material. (b) A form in which a photosensitive silver halide black-and-white sensitive material containing physical development nuclei in a silver halide emulsion layer is dissolved and physically developed to form a metal silver portion on the photosensitive material. (c) A form in which a photosensitive silver halide black-and-white sensitive material containing no physical development nucleus and an image receiver sheet having a non-photosensitive layer containing physical development nuclei are laid on each other, diffused, transferred and developed to form a metal silver portion on the non-photosensitive image receiver sheet.

The aforementioned form (a) is an integrated black-and-white development type in which a translucent conductive film such as a light transmissive conductive film is formed on the photosensitive material. The obtained developed silver is a chemically developed silver or a thermally developed silver, which is highly active in a subsequent process of plating or physical developing because of a filament with a high specific surface.

In the aforementioned form (b), silver halide particles around a physical development nucleus are dissolved in an exposure portion and deposited on the development nucleus so that a translucent conductive film such as a light transmissive conductive film can be formed on the photosensitive material. This is also an integrated black-and-white development type. Development operation is highly active due to deposition onto physical development nuclei. However, developed silver is spherical with a small specific surface.

In the aforementioned form (c), silver halide particles are dissolved and diffused in a non-exposed portion so as to be deposited onto the development nuclei on the image receiver sheet. Thus, a translucent conductive film such as a light transmissive conductive film is formed on the light receiver sheet. The form (c) is a so-called separate type, in which the light receiver sheet is separated from the photosensitive material in use.

In any form, either development of negative development treatment or development of reversal development treatment may be selected (in the case of the diffusion transfer system, negative development treatment can be selected using an auto-positive photosensitive material as the photosensitive material).

Chemical development, thermal development, dissolving physical development and diffusion transfer development mentioned herein mean developments designated by the terms used usually in the field of the art. Those are explained in a general textbook of photographic chemistry, for example, "Photographic Chemistry", written by Shinichi Kikuchi (published by Kyoritsu Shuppan Co., Ltd. in 1955), or "The Theory of Photographic Processes, 4th ed." edited by C. E. K. Mees (published by Mcmillan Co. in 1977). The present invention relates to liquid treatment, but it may also refer to techniques to which a thermal development system is applied as another development system. For example, techniques disclosed in JP-A-2004-184693, JP-A-2004-334077, JP-A-2005-010752, Japanese Patent Application No. 2004-244080, and Japanese Patent Application No. 2004-085655 may be applied.

In addition, description and technology disclosed in JP-A-2006-352073 which is an invention of an electromagnetic wave shield film, or description and technology disclosed in Japanese Patent Application No. 2009-265467 which is an invention of a capacitive touch panel may be used as a material and a method for manufacturing a conductive pattern for use in the present invention.

Incidentally, conductive materials for use in the upper electrode and the lower electrode do not have to have light transmissivity, but light transmissive conductive materials may be also used for the upper electrode and the lower electrode. Examples of the light transmissive conductive materials may include conductive polymers or some metal oxides. Metal oxides should be used in terms of durability and antiweatherability. Examples of transparent metal oxides may include indium tin oxide (ITO), antimony doped tin oxide (ATO), tin oxide, aluminum doped zinc oxide (ZnO:Al), indium zinc oxide (In2O3-ZnO (IZO)), etc. The aforementioned oxides may be used for electrode pieces forming the lower electrode in the present invention. Of the aforementioned oxides, ITO or IZO is preferably used from the point of view of its resistance value, transparency and easiness to be formed as a film. A sputtering method, an electron beam method, an ion plating method, etc. may be used for forming a thin film of ITO or IZO.

All the materials illustrated in and after the aforementioned paragraph [1] may be used for the upper electrode and the lower electrode.

Figure 35:
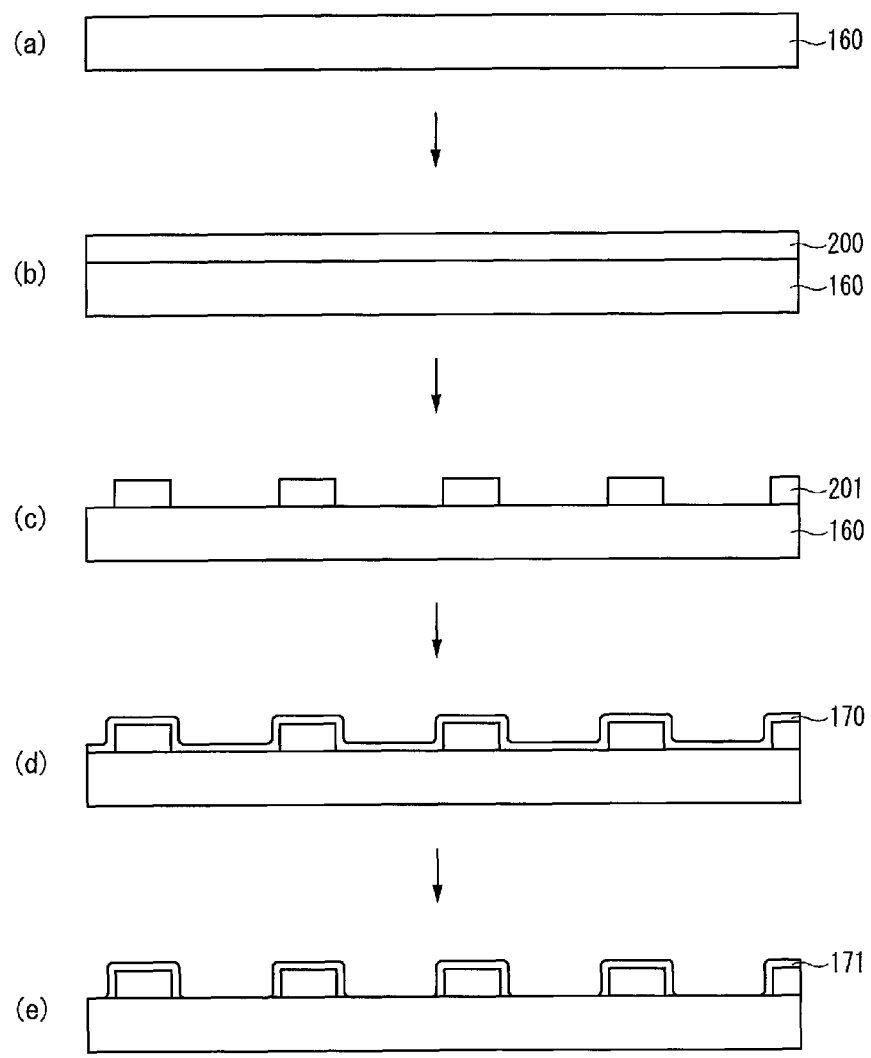
FIG. 35 An example of a method for forming a conducting wire pattern.

Here, a formation method in the case in which a material for forming electrodes is used as metal foil or a thin film (the case of the aforementioned paragraph [2]) will be described with reference to FIG. 35. FIG. 35 shows a method for forming the upper electrode (FIG. 4, FIG. 17, FIG. 25 or the like), but the lower electrode is formed in the same manner as the upper electrode.

(a) of FIG. 35 shows a transparent base 160 (corresponding to the transparent substrate 11 or the transparent substrate 12 in FIG. 1) which also serves as an insulating layer. The transparent base 160 is, for example, a PET film about 100 μm thick. The surface of the film is cleaned, and next a thin layer 200 of metal or alloy is provided on the surface of the film ((b) of FIG. 35). The materials described in the aforementioned paragraph [2] may be used as the metal. Silver, copper, aluminum or alloy of these is preferably used. A sputtering method or the like is used as the method for forming the thin layer, but another method may be used. The thickness of the formed metal thin layer can be adjusted suitably in accordance with a desired resistance value. The thickness is preferably not smaller than 0.1 μm and not larger than 3 μm, more preferably not smaller than 0.2 μm and not larger than 1 μm.

Next, a photoresist film is formed on the metal thin film 200 formed as described above, exposed to light using a photomask, and developed with a developer to form a pattern of the resist film. This is etched by an etchant, and the resist film is separated and removed to form a conductive wire pattern 201 consisting of metal thin wires ((c) of FIG. 35). By such a patterning process based on photolithography and etching, a conductive wire pattern of the upper electrode with disconnection parts CL is formed as shown in FIG. 4, FIG. 17 or FIG. 25. A conductive wire pattern of the lower electrode is formed in the same manner as the conductive wire pattern of the upper electrode.

Next, formation of a coating layer provided on the conductive wire pattern formed as described above will be described. Incidentally, this coating layer does not have to be formed. This coating layer is called a blackening layer. The blackening layer has a visual function of obscuring metallic luster of metal or alloy and a function of improving the durability by means of anticorrosion of metal and prevention of migration. The material of the blackening layer (coating layer) will be described below separately. The thickness of the blackening layer (coating layer) is preferably not larger than 5 μm, more preferably not larger than 3 μm, particularly preferably not smaller than 0.2 μm and not larger than 2 μm.

As shown in (d) of FIG. 35, a blackening layer 170 is formed to coat all the surfaces of the conductive wire pattern 201 and the transparent base 160. A blackening layer portion on the pattern formation region where the electrode thin wires are not coated with the blackening layer 170 is then removed to form a blackening layer 171 coating only the conductive layer pattern 201 ((e) of FIG. 35). Thus, it is possible to form a conductive pattern electrode superior in visibility and durability.

Next, description will be made on the material and the method for forming the aforementioned blackening layer (coating layer). Examples of preferred methods for stacking the blackening layer may include a plating process and a chemical etching method.

Any plating process may be used if it is a known process called black plating. Examples of the plating processes may include black Ni plating, black Cr plating, black Sn—Ni alloy plating, Sn—Ni—Cu alloy plating, black zinc chromate treatment, etc. Specifically, black plating bath manufactured by Nihon Kagaku Sangyo Co., Ltd. (trade name is NIKKA BLACK, Sn—Ni alloy-based), black plating bath manufactured by Kinzoku Kagaku Kogyo K.K. (trade name is EBONY CHROME 85 series, Cr-based), or chromate agent manufactured by Dipsol Chemicals Co., Ltd. (trade name is ZB-541, zinc plating black chromate agent) may be used. Either non-electrolytic plating or electrolytic plating may be used as the plating method. The plating may be performed on gentle conditions or high-rate conditions. Plating thickness may be not limited if it is thick enough to be recognized as black. The ordinary plating thickness is preferably 1 μm to 5 μm.

Oxidation treatment or sulfurization treatment may be applied to a part of a conductive metal portion so as to form a black portion. For example, when the conductive metal portion consists of copper, the trade name EMPLATE MB438A, B manufactured by Meltex Inc., the trade name nPE-900 manufactured by Mitsubishi Gas Chemical Company, Inc., the trade name MEC ETCH BOND BO-7770V manufactured by MEC Co., Ltd., the trade name COPPER BLACK CuO, the same CuS, and selenium-based copper black No. 65 manufactured by Isolate Chemical Laboratory Co., Ltd., etc. may be, for example, used as a treatment agent for blackening the copper surface. In addition to the aforementioned treatment, sulfide may be processed to generate hydrogen sulfide ($H_2S$), with which the surface of copper is blackened as copper sulfide (CuS). The thickness in these treatments is not limited as long as it can be recognized as black, but it is ordinarily preferable not larger than 3 μm, more preferably 0.2 μm to 2 μm.

When ink (or paste) containing conductive nanoparticles is used (the aforementioned paragraph [3]), the aforementioned pattern may be printed directly on the transparent base layer also serving as an insulating layer.

Figure 36:
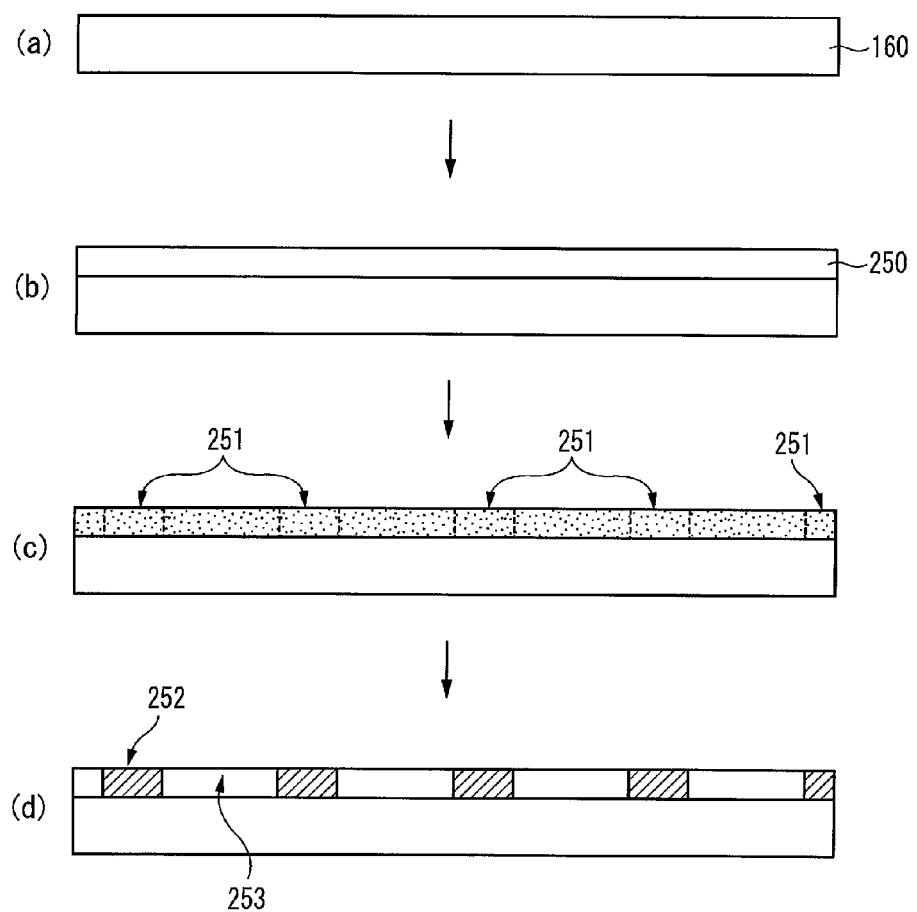
FIG. 36 Another example of a method for forming a conducting wire pattern.

Next, the case where a silver halide photographic sensitive material for use in photography is used as the electrode formation material (the aforementioned paragraph [4]) will be described with reference to FIG. 36. FIG. 36 shows a method for forming the upper electrode (FIG. 4, FIG. 17, FIG. 25 or the like). The lower electrode is formed in the same manner as the upper electrode.

Incidentally, the silver halide photographic sensitive material for use in the present invention has been described in detail in JP-A-2006-352073 which is an invention of an electromagnetic wave shield film using a thin wire pattern based on developed silver.

(a) of FIG. 36 shows a transparent base 160 which also serves as an insulating layer. The transparent base 160 is, for example, a PET film about 100 μM thick. The surface of the film is cleaned, and next a thin layer 250 of a silver halide photographic sensitive material is provided on the surface of the film ((b) of FIG. 36). The silver halide photographic sensitive material contains silver halide superior in properties as a light sensor, a binder such as gelatin, and various additives such as coating aid or additive for adjusting sensitivity. The amount of applied silver (the application amount of silver salt) is preferable 1 to 30 $g/m^2$ in silver equivalent, more preferably 1 to 25 $g/m^2$, further preferably 5 to 20 $g/m^2$. When the amount of applied silver is set within the aforementioned range, the conductive sheet on which exposure and development treatment has been performed can acquire a desired surface resistance. To form a thin film, a multi-layer applicator for use in manufacturing a photographic material is preferably used.

Next, pattern-like exposure is performed to form conductive thin wires on the aforementioned thin layer 250 of the silver halide photographic sensitive material. In (c) of FIG. 36, the regions where photosensitive nuclei have been generated by the exposure are represented by the reference sign 251. The exposed film on which developing and fixing treatment has been performed is shown in (d) of FIG. 36. The reference sign 252 represents an aggregate of silver formed around the photosensitive nuclei by the development, and the reference sign 253 represents a transparent layer from which silver salt etc. contained in a not-exposed portion of the silver halide photographic sensitive material has been removed out of the layer by fixing treatment. A thin wire pattern based on developed silver can be formed in this manner.

As described above, in this specification, disclosed is a touch panel including:

a first electrode in which second-direction parallel bands having a plurality of conducting wires disposed to extend in parallel with one another and along a second direction intersecting with a first direction are formed repeatedly in the first direction with interposition of first-direction gaps in the first direction, and first-direction cross bands having conducting wires disposed to extend in the first direction and intersect with the second-direction parallel bands are formed repeatedly in the second direction; and a second electrode in which first-direction parallel bands having a plurality of conducting wires disposed to extend in parallel with one another and along the first direction are formed repeatedly in the second direction with interposition of second-direction gaps in the second direction, and second-direction cross bands having conducting wires disposed to extend in the second direction and intersect with the first-direction parallel bands are formed repeatedly in the first direction; the touch panel being characterized in that:

the first electrode and the second electrode are laid on each other so that the second-direction cross bands correspond to positions of the first-direction gaps and the first-direction cross bands correspond to positions of the second-direction gaps.

According to this touch panel, due to large tolerance for errors in laying the first electrode and the second electrode on each other or for shape errors in the conducting wires, spreading or interference fringes can be prevented from occurring easily even if the first electrode and the second electrode are misaligned to some extent or there is a variety among the shapes of the conducting wires. Thus, a novel conducting wire pattern in which the grid-like shape of the conducting wires does not look incompatible can be obtained with a good yield and inexpensively. In addition, since spreading or interference fringes are prevented from occurring easily even when the interval (pitch) of the conducting wires is narrowed, the density with which the conducting wires are disposed can be increased to improve the sensibility for detecting touch.

Since low-resistance metal thin wires can be used for the conducting wire pattern, good responsiveness can be obtained. It is therefore possible to provide a touch panel supporting a large-screen or high-definition display In addition, in the touch panel disclosed in this specification:

when the first electrode and the second electrode are seen through;

the conducting wires included in the first-direction parallel bands and the first-direction cross bands are arranged at a fixed interval to each other;

the conducting wires included in the second-direction parallel bands and the second-direction cross bands are arranged at a fixed interval to each other; and a uniform grid-like pattern is formed out of the first-direction parallel bands, the second-direction parallel bands, the first-direction cross bands and the second-direction cross bands.

According to this touch panel, the in-plane distribution of the conducting wires on the transparent substrate where the conducting wire pattern is formed is made so uniform that the conducting wire pattern can be prevented to the utmost from being visually recognized.

In addition, in the touch panel disclosed in this specification:

each of the number of conducting wires making up each of the first-direction parallel bands and the number of conducting wires making up each of the second-direction parallel bands is at least three; and each of the number of conducting wires making up each of the first-direction cross bands and the number of conducting wires making up each of the second-direction cross bands is not smaller than 1 and not larger than 10, but is smaller than each of the number of conducting wires making up each of the first-direction parallel bands and the number of conducting wires making up each of the second-direction parallel bands.

According to this touch panel, a grid-like pattern based on the first and second electrodes laid on each other can be formed easily out of the aforementioned number of conducting wires. In addition, when the conducting wire pattern of each of the first and second electrodes is disconnected and sectioned into a plurality of electrodes, a group of regions in which a plurality of parallel conducting wires are electrically connected to one another through conducting wires crossing the parallel conducting wires can be formed easily from the aforementioned number of conducting wires. Thus, electrodes can be formed easily.

In addition, in the touch panel disclosed in this specification:

the conducting wires included in each of the first-direction parallel bands and the second-direction parallel bands are disposed densely at a lower pitch than the pitch of each of the first-direction cross bands and the second-direction cross bands.

According to this touch panel, a group of conducting wires disposed densely are electrically connected to one another by conducting wires disposed more sparsely, so that a grid-like pattern of the first and second electrodes laid on each other can be formed easily while electrode pieces grouped as one region can be formed easily when electrodes are sectioned and formed. Here, the group of conducting wires disposed densely are disposed at a small pitch so that the sensitivity in touch detection can be enhanced. In addition, since the conducting wires for electrically connecting the electrodes pieces with one another are disposed sparsely, the pattern design with which the first electrode arrays and the second electrode arrays are arranged to be prevented from overlapping in see-through view can be prevented from being complicated.

In addition, in a touch panel disclosed in this specification:

the pitch of the conducting wires included in each of the first-direction parallel bands and the second-direction parallel bands is not lower than 150 μm and not higher than 400 μm; and the pitch of each of the first-direction cross bands and the second-direction cross bands is not lower than 2,000 μm and not higher than 10,000 μm.

According to this touch panel, a grid-like pattern of the first and second electrodes laid on each other can be formed easily due to the aforementioned pitches. In addition, electrodes can be formed easily when the conducting wire patterns of the first and second electrodes are disconnected and sectioned into a plurality of electrodes respectively.

In addition in a touch panel disclosed in this specification:

the first-direction cross bands of the first electrode are arranged at a pitch equal to the total width of each of the first-direction parallel bands and each of the second-direction gaps formed in the second electrode;

the second-direction cross bands of the second electrode are arranged at a pitch equal to the total width of each of the second-direction parallel bands and each of the first-direction gaps formed in the first electrode.

According to this touch panel, spreading or interference fringes can be prevented. Thus, a novel conducting wire pattern whose grid-like shape does not look incompatible can be obtained with a good yield and inexpensively.

In addition, in a touch panel disclosed in this specification:

the width of each of the conducting wires making up the first-direction parallel bands and the second-direction parallel bands is not smaller than 2 μm and not larger than 10 μm; and the pitch of the conducting wires in each of the first-direction parallel bands and the second-direction parallel bands is not lower than 250 nm and not higher than 350 μm.

According to this touch panel, both the visibility (prevention of conducting wires or moire from visual recognition) and the sensitivity can be obtained with a good balance due to the aforementioned widths and pitches.

In addition, in a touch panel disclosed in this specification:

the first electrode has first electrode arrays in each of which electrode pieces are arrayed, the electrode pieces being sectioned by selective disconnection of portions of the conducting wires intersecting with edge lines of closed figures assumed on the first electrode;

the second electrode has second electrode arrays in each of which electrode pieces are arrayed in a direction intersecting with a direction in which the first electrode arrays are arrayed, the electrode pieces being sectioned by selective disconnection of portions of the conducting wires intersecting with edge lines of closed figures assumed on the second electrode;

the first electrode arrays and the second electrode arrays are disposed repeatedly in fixed directions intersecting with each other respectively; and the electrode pieces of the first electrode and the second electrode are arrayed not to be superimposed on each other when the first electrode and the second electrode are seen through.

According to this touch panel, the conducting wire patterns of the first and second electrodes are disconnected in suitable positions respectively so that the first electrode arrays and the second electrode arrays can be formed. The coordinates of a touch position are formed by the first and second electrode arrays intersecting with each other when the first and second electrodes are laid on each other. In the see-through state in which the first and second electrodes have been laid on each other, the electrode pieces are arranged densely without overlapping one another, so that the sensitivity in touch detection can be enhanced to high sensitivity. In addition, since dummy electrodes are formed at the same time as the electrode pieces are formed, the touch panel supporting a large-screen or high-definition display can be prevented from short-circuiting during high-frequency drive.

In addition, in a touch panel disclosed in this specification:

a mirror-image relationship is established between a pattern of the conducting wires included in the first electrode and a pattern of the conducting wires included in the second electrode.

According to this touch panel, the cost of design of conducting wire patterns can be saved due to the mirror-image relationship.

In addition, in a touch panel disclosed in this specification:

each of the electrode pieces in each of the first electrode arrays is formed inside the closed figure by disconnection of a portion of each of the second-direction parallel bands intersecting with the edge line of the closed figure passing through the first-direction gaps at two places on each of the first-direction cross bands, and the electrode pieces are arranged in the first direction in a state in which electric continuity among the electrode pieces is secured by the conducting wires of each of the first-direction cross bands; and each of the electrode pieces in each of the second electrode arrays is formed inside the closed figure by disconnection of a portion of each of the second-direction parallel bands intersecting with the edge line of the closed figure passing through the second-direction gaps at two places on each of the second-direction cross bands, and the electrode pieces are arranged in the second direction in a state in which electric continuity among the electrode pieces is secured by the conducting wires of each of the second-direction cross wires.

According to this touch panel, a novel electrode array pattern whose grid-like pattern does not look incompatible when the first and second electrodes are laid on each other can be obtained.

In addition, in a touch panel disclosed in this specification:

each of the electrode pieces in each of the first electrode arrays is formed inside the closed figure by disconnection of a portion of each of the first-direction cross bands intersecting with the edge line of the closed figure passing through one point on the first electrode and another point on the first electrode spaced apart from the one point in a third direction intersecting both the first direction and the second direction, and a portion of each of the second-direction parallel bands intersecting with the edge line of the closed figure excluding non-disconnection parts near the one point and the other point, and the electrode pieces are arranged in a state in which the electrode pieces are electrically connected to one another through the non-disconnection parts; and each of the electrode pieces in each of the second electrode arrays is formed inside the closed figure by disconnection of a portion of each of the second-direction cross bands intersecting with the edge line of the closed figure passing through one point on the second electrode and another point on the second electrode spaced apart from the one point in a fourth direction intersecting the first direction, the second direction and the third direction, and a portion of each of the first-direction parallel bands intersecting with the edge line of the closed figure excluding non-disconnection parts near the one point and the other point, and the electrode pieces are arranged in a state in which the electrode pieces are electrically connected to one another through the non-disconnection parts.

According to this touch panel, a novel electrode array pattern whose grid-like pattern does not look incompatible when the first and second electrodes are laid on each other can be obtained.

In addition, in a touch panel disclosed in this specification:

the conducting wires extending along the first direction and the conducting wires extending along the second direction are inclined with respect to a direction in which pixels belonging to a display on which the touch panel is stacked are arranged.

According to this touch panel, light interference hardly occurs between each conducting wire constituting the conducting wire pattern and the edge of each pixel or the like. Thus, interference fringes (moire) can be prevented from occurring.

In addition, in a touch panel disclosed in this specification:

the first direction is set to be parallel or perpendicular to a direction in which pixels belonging to an image display apparatus on which the touch panel is stacked are arranged, and the second direction is set to be perpendicular or parallel to the direction.

According to this touch panel, the coordinates of the position of a touch point coincide with the XY coordinates of the image display apparatus without any correction performed on the coordinates. It is therefore possible to easily perform processing for calculating the touch position.

In addition, in a touch panel disclosed in this specification:

in each disconnection part which is a set of the disconnected portions of the conducting wires intersecting with the edge line of the closed figure, at least one of disconnection lengths in a direction intersecting with the edge line, and disconnection positions in a direction intersecting with the edge line change at random in a direction along the edge line.

According to this touch panel, the conducting wire pattern is hardly recognized visually as uneven with regularity, as compared with the case where the disconnection parts are formed linearly. That is, it is possible to prevent the display quality of the display from lowering due to the touch panel mounted thereon.

In addition, in a touch panel disclosed in this specification:

each non-disconnection part formed to include the portions of the conducting wires which are not disconnected when the electrode pieces are sectioned is formed out of at least two conducting wires.

According to this touch panel, electrode pieces constituting each electrode array are electrically connected to one another through a plurality of conducting wires. Therefore, the electric continuity can be secured even if some conducting wires of the conducting wires are disconnected due to burnout or the like in use.

In addition, in a touch panel disclosed in this specification:

the closed figure is a polygon.

According to this touch panel, due to the electrode pieces each shaped like a polygon, the electrode pieces can be formed easily out of a group of conducting wires extending in the first and second directions respectively.

In addition, this specification discloses an image display apparatus including:

the aforementioned touch panel; and a display on which the touch panel is stacked.

According to this image display apparatus, operation and effect similar to the aforementioned ones can be obtained due to the touch panel configured as described previously.

Incidentally, the present invention may be used in suitable combination with publications before examination and techniques in international publication pamphlets described in the following Table 1 and Table 2. Information such as "JP-A-", "publication No.", "pamphlet No.", etc. is omitted.

TABLE 1

| | | | | |
|---|---|---|---|---|
| 2004-221564 | 2004-221565 | 2007-200922 | 2006-352073 | 2007-129205 |
| 2007-235115 | 2007-207987 | 2006-012935 | 2006-010795 | 2006-228469 |
| 2006-332459 | 2009-21153 | 2007-226215 | 2006-261315 | 2007-072171 |
| 2007-102200 | 2006-228473 | 2006-269795 | 2006-269795 | 2006-324203 |
| 2006-228478 | 2006-228836 | 2007-009326 | 2006-336090 | 2006-336099 |
| 2006-348351 | 2007-270321 | 2007-270322 | 2007-201378 | 2007-335729 |
| 2007-134439 | 2007-149760 | 2007-208133 | 2007-178915 | 2007-334325 |
| 2007-310091 | 2007-116137 | 2007-088219 | 2007-207883 | 2007-013130 |
| 2005-302508 | 2008-218784 | 2008-227350 | 2008-227351 | 2008-244067 |
| 2008-267814 | 2008-270405 | 2008-277675 | 2008-277676 | 2008-282840 |
| 2008-283029 | 2008-288305 | 2008-288419 | 2008-300720 | 2008-300721 |
| 2009-4213 | 2009-10001 | 2009-16526 | 2009-21334 | 2009-26933 |
| 2008-147507 | 2008-159770 | 2008-159771 | 2008-171568 | 2008-198388 |
| 2008-218096 | 2008-218264 | 2008-224916 | 2008-235224 | 2008-235467 |
| 2008-241987 | 2008-251274 | 2008-251275 | 2008-252046 | 2008-277428 |

TABLE 2

| | | | | |
|---|---|---|---|---|
| 2006/001461 | 2006/088059 | 2006/098333 | 2006/098336 | 2006/098338 |
| 2006/098335 | 2006/098334 | 2007/001008 | | |

INDUSTRIAL AVAILABILITY

According to a touch panel of the present invention, due to large tolerance for errors in laying a first electrode and a second electrode on each other or for shape errors in conducting wires, it is possible to obtain a novel conducting wire pattern whose grid-like shape does not look incompatible even when the first electrode and the second electrode are misaligned to some extent or there is a variety among the shapes of the conducting wires. That is, it is possible to provide a capacitive or resistive, capacitive touch panel which can be manufactured easily using thin wires such as metal thin wires.

Although the present invention has been described in detail and with reference to special embodiments thereof, it is obvious for those skilled in the art that various changes or modifications can be made on the present invention without departing from the spirit and scope of the present invention.

This application is based on Japanese Patent Application (No. 2010-249208) filed on Nov. 5, 2010, and the contents thereof are herein incorporated by reference.

REFERENCE SIGNS LIST

AD adhesive layer
CL disconnection part
D1 first direction
$D1_2$ first direction
$D1_3$ first direction
D2 second direction
$D2_2$ second direction
$D2_3$ second direction
D3 third direction
D4 fourth direction
D5 fifth direction
D6 sixth direction
F1 quadrangle
F2 quadrangle
F3 rhombus
NC non-disconnection part
P1 pitch
P2 pitch
Ps1 point
Ps2 point
S1 first-direction gap
S2 second-direction gap
1-3 touch panel
9 display
9A image display portion
9B frame portion
11 transparent substrate
12 transparent substrate
13 dielectric layer
14 adhesive layer
15 transparent cover member
16 transparent film
17 dot spacer
18 conducting wire pattern formation region
20 upper electrode (first electrode)
21 first-direction cross band
22 second-direction parallel band 25 auxiliary thin wire
30 first electrode array
31 electrode piece
35 dummy electrode
40 lower electrode (second electrode)
41 first-direction parallel band
42 second-direction cross band
50 second electrode array
51 electrode piece
60 upper electrode (first electrode)
65 dummy electrode
70 first electrode array
71 electrode piece
80 lower electrode (second electrode)
90 second electrode array
91 electrode piece
210 conducting wire
220 conducting wire
410 conducting wire
420 conducting wire
100 touch panel
101 touch panel
102 touch panel
120 upper electrode (first electrode)
121 first-direction cross band
130 first electrode array
135 dummy electrode
131 electrode piece
140 lower electrode (second electrode)
142 second-direction cross band
150 second electrode array
151 electrode piece
191 upper electrode bus bar
192 lower electrode bus bar
320 upper electrode (first electrode)
340 lower electrode (second electrode)

The invention claimed is:

1. A touch panel comprising:
   a first electrode in which second-direction parallel bands having a plurality of conducting wires disposed to extend in parallel with one another and along the second direction intersecting with a first direction are formed repeatedly in the first direction with interposition of first-direction gaps in the first direction, and first-direction cross bands having conducting wires disposed to extend in the first direction and intersect with the second-direction parallel bands are formed repeatedly in the second direction; and
   a second electrode in which first-direction parallel bands having a plurality of conducting wires disposed to extend in parallel with one another and along the first direction are formed repeatedly in the second direction with interposition of second-direction gaps in the second direction, and second-direction cross bands having conducting wires disposed to extend in the second direction and intersect with the first-direction parallel bands are formed repeatedly in the first direction,
   wherein a conductive wire is not provided in the first-direction gaps, and a conductive wire is not provided in the second-direction gaps, and
   the first electrode and the second electrode are laid on each other so that the second-direction cross bands correspond to positions of the first-direction gaps and the first-direction cross bands correspond to positions of the second-direction gaps.

2. The touch panel according to claim 1, wherein:
   when the first electrode and the second electrode are seen through;
   the conducting wires included in the first-direction parallel bands and the first-direction cross bands are arranged at a fixed interval to each other;
   the conducting wires included in the second-direction parallel bands and the second-direction cross bands are arranged at a fixed interval to each other; and
   a uniform grid-like pattern is formed out of the first-direction parallel bands, the second-direction parallel bands, the first-direction cross bands and the second-direction cross bands.

3. The touch panel according to claim 1, wherein:
   each of the number of conducting wires making up each of the first-direction parallel bands and the number of conducting wires making up each of the second-direction parallel bands is at least three; and
   each of the number of conducting wires making up each of the first-direction cross bands and the number of conducting wires making up each of the second-direction cross bands is not smaller than 1 and not larger than 10, but is smaller than each of the number of conducting wires making up each of the first-direction parallel bands and the number of conducting wires making up each of the second-direction parallel bands.

4. The touch panel according to claim 1, wherein:
   the conducting wires included in each of the first-direction parallel bands and the second-direction parallel bands are disposed densely at a lower pitch than the pitch of each of the first-direction cross bands and the second-direction cross bands.

5. The touch panel according to claim 4, wherein:
   the pitch of the conducting wires included in each of the first-direction parallel bands and the second-direction parallel bands is not lower than 150 μm and not higher than 400 μm; and
   the pitch of each of the first-direction cross bands and the second-direction cross bands is not lower than 2,000 μm and not higher than 10,000 μm.

6. The touch panel according to claim 1, wherein:
   the first-direction cross bands of the first electrode are arranged at a pitch equal to the total width of each of the first-direction parallel bands and each of the second-direction gaps formed in the second electrode; and
   the second-direction cross bands of the second electrode are arranged at a pitch equal to the total width of each of the second-direction parallel bands and each of the first-direction gaps formed in the first electrode.

7. The touch panel according to claim 1, wherein:
   the width of each of the conducting wires making up the first-direction parallel bands and the second-direction parallel bands is not smaller than 2 μm and not larger than 10 μm; and
   the pitch of the conducting wires in each of the first-direction parallel bands and the second-direction parallel bands is not lower than 250 μm and not higher than 350 μm.

8. The touch panel according to claim 1, wherein:
   the first electrode has first electrode arrays in each of which electrode pieces are arrayed, each of the electrode pieces being sectioned by selective disconnection of portions of the conducting wires intersecting with an edge line of a closed figure assumed on the first electrode;
   the second electrode has second electrode arrays in each of which electrode pieces are arrayed in a direction intersecting with a direction in which the first electrode arrays are arrayed, each of the electrode pieces being sectioned by selective disconnection of portions of the conducting wires intersecting with an edge line of a closed figure assumed on the second electrode;

the first electrode arrays and the second electrode arrays are disposed repeatedly in fixed directions intersecting with each other respectively; and the electrode pieces of the first electrode and the second electrode are arrayed not to be superimposed on each other when the first electrode and the second electrode are seen through.

9. The touch panel according to claim 8, wherein a mirror-image relationship is established between a pattern of the conducting wires included in the first electrode and a pattern of the conducting wires included in the second electrode.

10. The touch panel according to claim 8, wherein:

each of the electrode pieces in each of the first electrode arrays is formed inside the closed figure by disconnection of a portion of each of the second-direction parallel bands intersecting with the edge line of the closed figure passing through the first-direction gaps at two places on each of the first-direction cross bands, and the electrode pieces are arranged in the first direction in a state in which electric continuity among the electrode pieces is secured by the conducting wires of each of the first-direction cross bands; and each of the electrode pieces in each of the second electrode arrays is formed inside the closed figure by disconnection of a portion of each of the first-direction parallel bands intersecting with the edge line of the closed figure passing through the second-direction gaps at two places on each of the second-direction cross bands, and the electrode pieces are arranged in the second direction in a state in which electric continuity among the electrode pieces is secured by the conducting wires of each of the second-direction cross wires.

11. The touch panel according to claim 8, wherein:

each of the electrode pieces in each of the first electrode arrays is formed inside the closed figure by disconnection of a portion of each of the first-direction cross bands intersecting with the edge line of the closed figure passing through one point on the first electrode and another point on the first electrode spaced apart from the one point in a third direction intersecting both the first direction and the second direction, and a portion of each of the second-direction parallel bands intersecting with the edge line of the closed figure excluding non-disconnection parts near the one point and the other point, and the electrode pieces are arranged in a state in which the electrode pieces are electrically connected to one another through the non-disconnection parts; and each of the electrode pieces in each of the second electrode arrays is formed inside the closed figure by disconnection of a portion of each of the second-direction cross bands intersecting with the edge line of the closed figure passing through one point on the second electrode and another point on the second electrode spaced apart from the one point in a fourth direction intersecting the first direction, the second direction and the third direction, and a portion of each of the first-direction parallel bands intersecting with the edge line of the closed figure excluding non-disconnection parts near the one point and the other point, and the electrode pieces are arranged in a state in which the electrode pieces are electrically connected to one another through the non-disconnection parts.

12. The touch panel according to claim 1, wherein the conducting wires extending along the first direction and the conducting wires extending along the second direction are inclined with respect to a direction in which pixels belonging to a display on which the touch panel is stacked are arranged.

13. The touch panel according to claim 1, wherein the first direction is set to be parallel or perpendicular to a direction in which pixels belonging to a display on which the touch panel is stacked are arranged, and the second direction is set to be perpendicular or parallel to the direction.

14. The touch panel according to claim 8, wherein in each disconnection part which is a set of the disconnected portions of the conducting wires intersecting with the edge line of the closed figure, at least one of disconnection lengths in a direction intersecting with the edge line, and disconnection positions in a direction intersecting with the edge line change at random in a direction along the edge line.

15. The touch panel according to claim 11, wherein each non-disconnection part formed to include the portions of the conducting wires which are not disconnected when the electrode pieces are sectioned is formed out of at least two conducting wires.

16. The touch panel according to claim 8, wherein the closed figure is a polygon.

17. An image display apparatus comprising:
the touch channel panel according to claim 1; and
a display on which the touch panel is stacked.

* * * * *